US 011562938B2

(12) United States Patent
Liu et al.

(10) Patent No.: US 11,562,938 B2
(45) Date of Patent: Jan. 24, 2023

(54) SPACER WITH PATTERN LAYOUT FOR DUAL SIDE COOLING POWER MODULE

(71) Applicant: SEMICONDUCTOR COMPONENTS INDUSTRIES, LLC, Phoenix, AZ (US)

(72) Inventors: Yong Liu, Cumberland Foreside, ME (US); Liangbiao Chen, Scarborough, ME (US); Yusheng Lin, Phoenix, AZ (US); Chee Hiong Chew, Seremban (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/136,286

(22) Filed: Dec. 29, 2020

(65) Prior Publication Data

US 2022/0208635 A1    Jun. 30, 2022

(51) Int. Cl.
| | |
|---|---|
| *H01L 23/367* | (2006.01) |
| *H01L 21/48* | (2006.01) |
| *H01L 23/373* | (2006.01) |
| *H01L 23/31* | (2006.01) |
| *H01L 23/00* | (2006.01) |

(52) U.S. Cl.
CPC ........ *H01L 23/367* (2013.01); *H01L 21/4882* (2013.01); *H01L 23/3735* (2013.01); *H01L 23/315* (2013.01); *H01L 24/29* (2013.01)

(58) Field of Classification Search
CPC ............... H01L 23/367; H01L 21/4882; H01L 23/3735; H01L 24/29; H01L 23/315
See application file for complete search history.

(56) References Cited

U.S. PATENT DOCUMENTS

| | | | |
|---|---|---|---|
| 7,019,395 B2 | 3/2006 | Hirano et al. | |
| 9,275,926 B2 | 3/2016 | Hable et al. | |
| 9,390,996 B2 | 7/2016 | Jeon | |
| 2003/0106924 A1* | 6/2003 | Nobori | .......... H01L 25/072 228/256 |
| 2016/0225693 A1* | 8/2016 | Tolentino | .......... H01L 23/315 |

OTHER PUBLICATIONS

"Double Side Cooled IGBT Module", Infineon, Jan. 2018 (Tech report), downloaded from https://s3.i-micronews.com/uploads/2019/02/Yole_SP18375_Infineon_double_side_cooling_IGBT_sample.pdf, 40 pages.

* cited by examiner

*Primary Examiner* — Patricia D Valenzuela
(74) *Attorney, Agent, or Firm* — Brake Hughes Bellermann LLP

(57) ABSTRACT

A method includes bonding a device die to a direct bonded metal (DBM) substrate, bonding a spacer block to the device die, and at least partially reducing coefficient of thermal expansion (CTE) mismatches between the DBM substrate, the spacer block and the device die. At least partially reducing the CTE mismatches between the DBM substrate, the spacer block and the device die includes at least one of: disposing an arrangement of pillars and grooves in a surface region of the spacer block coupled to the device die, disposing at least one cavity in the spacer block, and disposing a groove in an outer conductive layer of the DBM substrate.

18 Claims, 17 Drawing Sheets

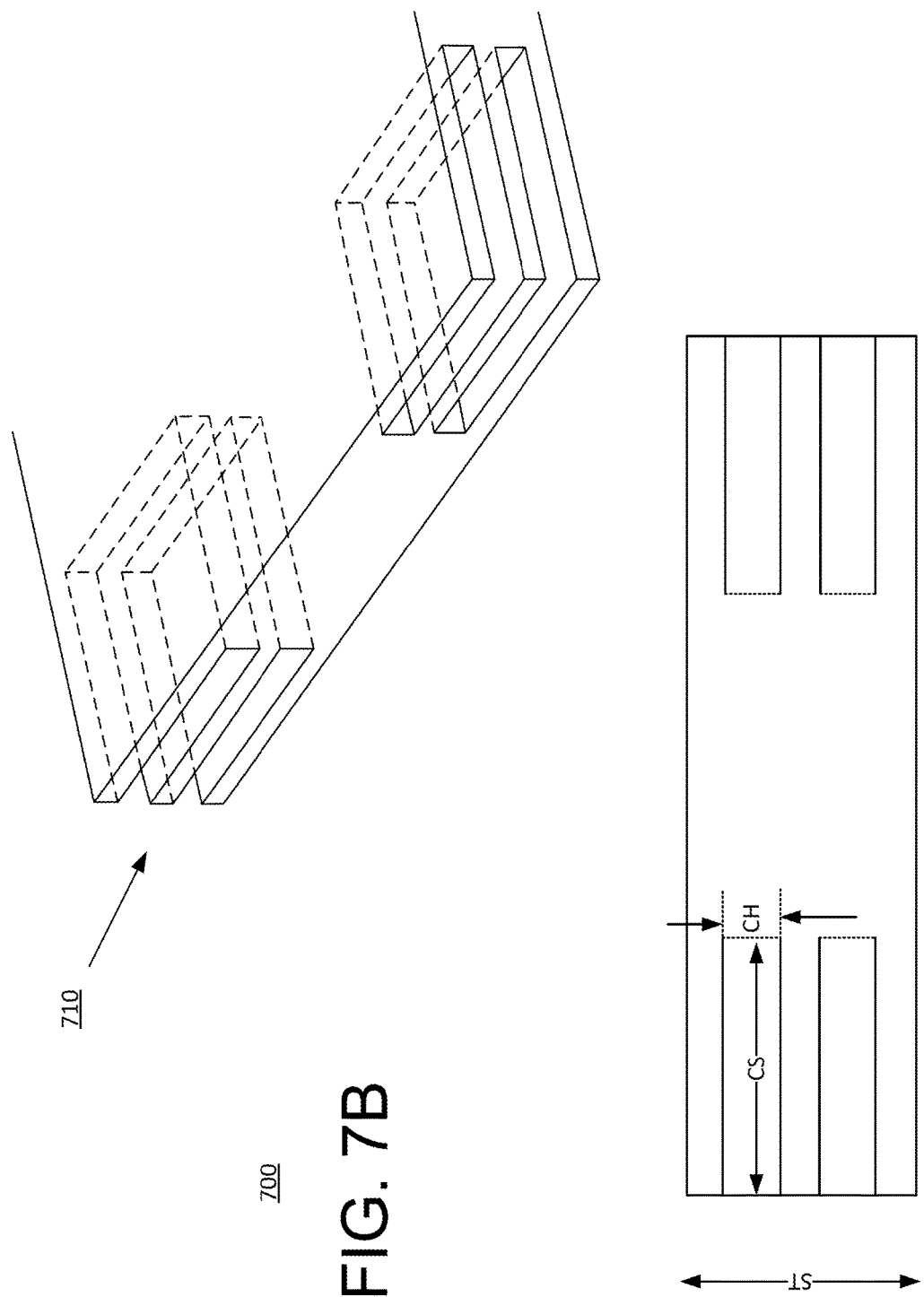

US 11,562,938 B2

SPACER WITH PATTERN LAYOUT FOR DUAL SIDE COOLING POWER MODULE

TECHNICAL FIELD

This description relates to high power device module and package structures

BACKGROUND

Semiconductor power devices can be manufactured as discrete devices as opposed to being integrated in an integrated circuit (IC). As is typical with power devices, thermal performance may dictate failure rates when components are heated above or cooled below certain temperatures. It may be desirable for some applications to engineer and manufacture power devices with sufficient performance, low cost, and high reliability. Thus, a need exists for systems, methods, and apparatus to address the shortfalls of present technology and to provide other new and innovative features.

SUMMARY

In a general aspect, a method includes bonding a device die to a direct bonded metal (DBM) substrate, bonding a spacer block to the device die, and at least partially reducing coefficient of thermal expansion (CTE) mismatches between the DBM substrate, the spacer block and the device die. At least partially reducing the CTE mismatches between the DBM substrate, the spacer block and the device die includes at least one of: disposing an arrangement of pillars and grooves in a surface region of the spacer block coupled to the device die, disposing at least one cavity in the spacer block, and disposing a groove in an outer conductive layer of the DBM substrate.

In a general aspect, a package includes a first direct bonded metal (DBM) substrate, a device die coupled to the first DBM substrate, and a spacer block coupled to a second DBM substrate. The spacer block includes a smooth surface region and a patterned surface region coupled to the device die. The patterned surface region includes an arrangement of recesses and protrusions that couple the patterned surface region to the device die.

In a general aspect, a package includes a first direct bonded metal (DBM) substrate, a device die coupled to the first DBM substrate, and a spacer block coupled to a second DBM substrate. a first direct bonded metal (DBM) substrate. The spacer block includes a first surface region and a second surface region. The first surface region is coupled to a corresponding first region and the second surface region is coupled to a corresponding second region of the device die, and at least one cavity is disposed in the spacer block between the second surface region and the second DBM substrate.

In a general aspect, a package includes a direct bonded metal (DBM) substrate including a first conductive layer disposed on a first side of a dielectric layer and a second conductive layer disposed on a second side of the dielectric layer. A device die is coupled to the first conductive layer on the first side of the dielectric layer of the DBM substrate. The device die includes at least one device contact pad in a surface region of the device die. At least one groove is disposed in a surface of the second conductive layer across from the surface region of the device die including the at least one device contact pad. The at least one groove at least partially reduces differences in the coefficient of thermal expansion (CTE) of materials (i.e. CTE mismatches) of the die corners and the at least one device contact pad.

DESCRIPTION

Figure 1A:
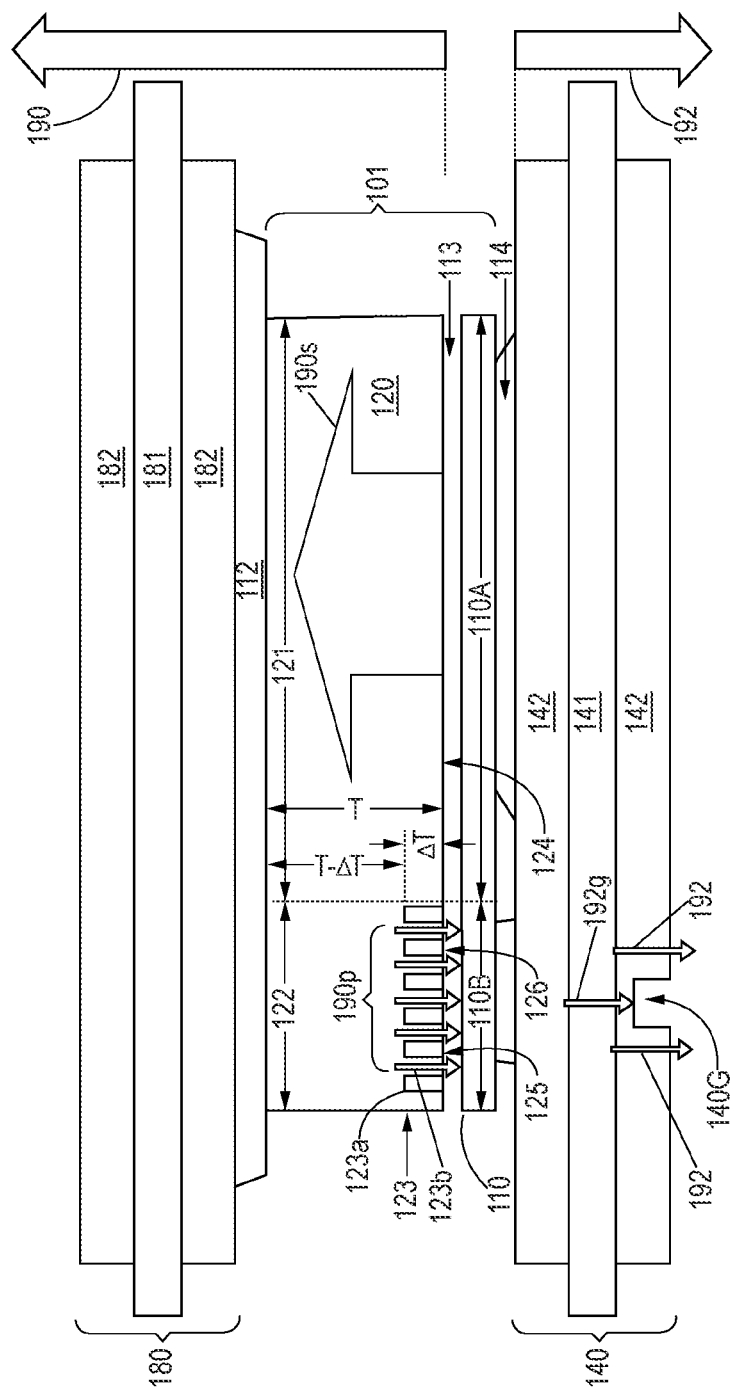
FIG. 1A illustrates an example dual-side cooled device package.

High power semiconductor devices (e.g., insulated-gate bipolar transistor (IGBT), power metal-oxide-semiconductor field effect transistor (MOSFETs), silicon carbide (SiC) device, fast recovery diode (FRD), etc.) and circuits are fabricated in semiconductor die that have increasingly large areas and decreasing thicknesses. Conductive metal or metalized device contacts, which can be referred to as device contact pads, disposed on a surface of the semiconductor die may provide external electrical contacts (e.g., device terminals) to an electronic device and circuit elements within the semiconductor die. Each device contact pad may provide an electrical connection for a respective specific input/output (I/O) function of the semiconductor die. In example implementations, a semiconductor die (including, e.g., an IGBT device) may have one or more device contact pads as external electrical contacts (e.g., emitter contact pads) to an emitter of the device, and several other device contact pads (e.g., signal sense contact pads) as external electrical contacts to other terminals (e.g., gate, emitter sense, collector sense, current sense, temperature sense cathode, temperature sense anode, etc.) of the device. For power devices, in which the emitter can carry high currents, the emitter contact pads may have areas that are substantially larger than the areas of the other pads (signal sense contact pads), for example, in proportion to the currents that may be expected to flow through the pads.

The high power semiconductor devices can operate at high temperature, but can require efficient thermal management. A traditional solution for thermal management of a power device is to package the device in a dual-side cooled package, where heat flows from the device can be extracted through two opposing package surfaces. In a typical a dual-side cooled device package, the power device die (semiconductor die) is coupled (e.g., using solder) to (i.e., bonded to) a conductive solid spacer block (heat slug) in a vertical stack. The solid spacer block may have a thickness T and a contact area A for bonding to the die. The vertical stack is placed between a pair of opposing cooling substrates (e.g., a first and a second direct bonded copper (DBC) substrate) with the semiconductor die in thermal contact with (i.e., bonded to) the first DBC substrate on one side of the package, and the spacer block in thermal contact with (i.e., bonded to) the second DBC substrate on a second side of the package. To transfer heat from the die to the outside of the package for dual-side cooling, heat is transferred from the die directly to the first DBC substrate, and through the spacer block to the second DBC substrate. Although the implementations are discussed in the context of a DBC substrate, the implementations can be applied to or used in connection with any type of direct bonded metal (DBM) substrate.

A rate of heat flow (e.g., in Joules per second, or Watts) perpendicularly through a material layer depends on a thermal conductivity k of the layer, a temperature difference $T_1-T_2$ across the layer, an area A of the layer, and a thickness $\Delta x$ of the layer. For the solid spacer block having a thickness T, a thermal conductivity k, and an area A, the rate of heat flow through spacer block in the dual-side cooled device package may, for example, be proportional to $kA*(T_1-T_1)/T$, where $T_1$ is temperature at the die side of the solid spacer block and T2 is the temperature at the (second) DBC substrate side of the solid spacer block. Thickness T may represent a length of the thermal path of heat flow perpendicular to the solid spacer block.

Stress induced by a coefficient of thermal expansion (CTE) mismatch between the die and the solid spacer (heat slug) can be a cause (e.g., root cause) for die crack formation, solder void formation, and solder peeling failure in the device package. Differences in the coefficients of thermal expansion (CTE) of the different components of the dual-side cooled device package (e.g., DBC substrates, semiconductor die, spacer block, solder joints, electronic mold compounds (EMC), etc.) can result in, for example, thermally-induced flexing, bending or warpage (warpage) of the components of the package. This thermally-induced warpage can have a deleterious effect, for example, on the mechanical and structural integrity of the intercomponent solder joints, and/or the electrical functioning and reliability of the device package. Additionally, excessive warpage of a DBC substrate can occur during attachment (bonding) of the die to the DBC substrate due to the CTE mismatch between the die side (e.g., printer circuit side with etched areas) of DBC and the exposed side (without etched areas), resulting in high stress in solder joints. Some of the thermally-induced warpage may be due to temperature gradients or inhomogeneities that may be present across the die horizontally. For example, small-area device contacts (e.g., signal sense contact pads) on a die may generate heat at a different level than a level of heat generated by large-area device contacts (e.g., emitter contact pads) on the die and result in horizontal temperature gradients or inhomogeneities across the die.

In a dual-side cooled device package, the temperature gradients and inhomogeneities across the die can be mitigated by using a spacer block having different spacer-die contact areas horizontally across the die, in accordance of the principles of the present disclosure.

Using different spacer-die contact areas across different horizontal regions of die may result in reduction of CTE between the spacer and the die. The CTE mismatch reduction may be adjusted by varying the spacer-die contact areas in the different horizontal regions in accordance of the principles of the present disclosure.

Increasing the length of the thermal paths of heat flow from the die through the spacer block (in other words, obstructing the shortest thermal paths for heat flow) or reducing the contact areas between the spacer block and the die can modify rates of heat flow. The length of the thermal paths of heat flow (e.g., perpendicular to the spacer block) can be increased by introducing obstructions to the heat flow perpendicular to the spacer block. Introducing different obstructions to the heat flow from different horizontal regions of the die may result in different rates of heat flow through the spacer block from the different horizontal regions of die. The different rates of heat flow from the different horizontal regions of die may modify or compensate, for example, horizontal temperature gradients or inhomogeneities that may occur across the die and the spacer block in the dual-side cooled device, in accordance of the principles of the present disclosure.

FIG. 1A shows an example dual-side cooled device package 100 including a spacer block having different spacer-die contact areas for different horizontal regions across an enclosed die, in accordance with the principles of the present disclosure.

Figure 1B:
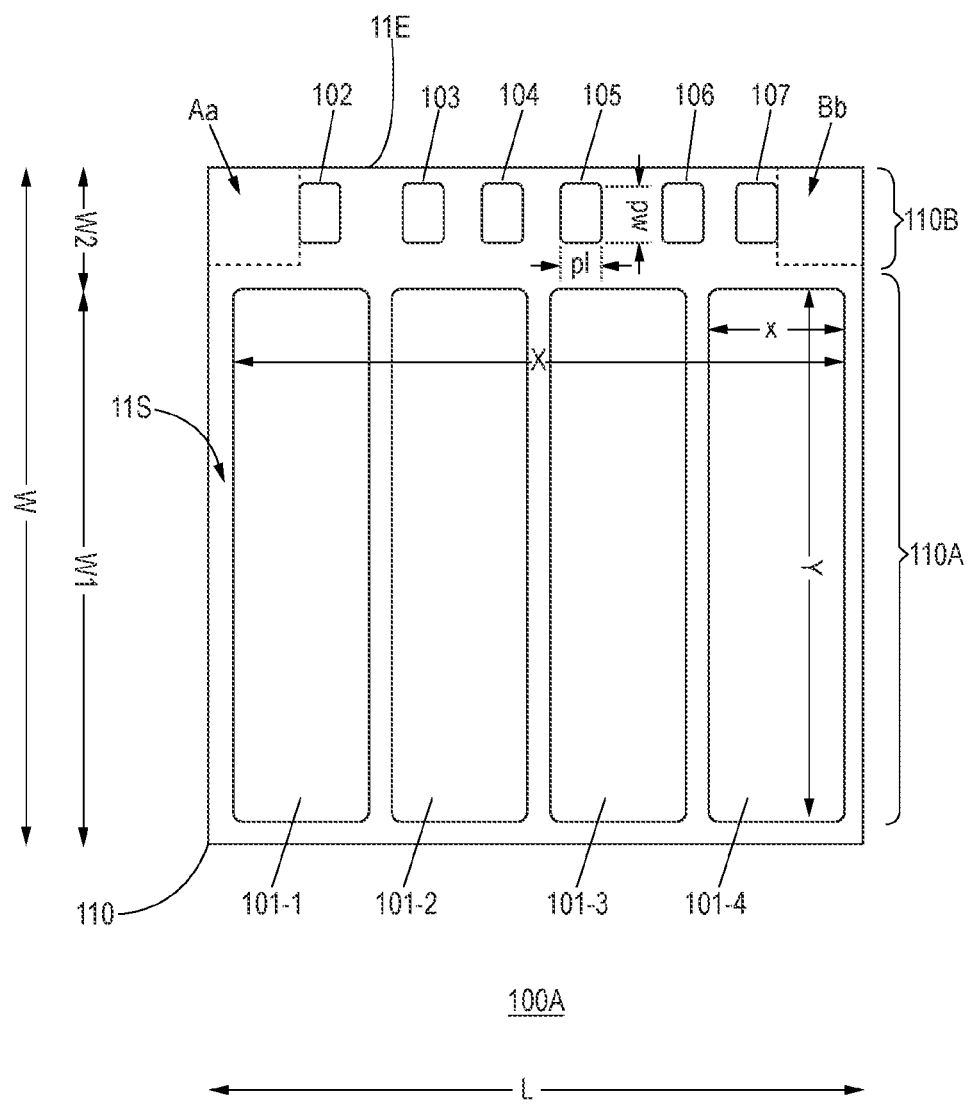
FIG. 1B illustrates an example layout of device contact pads disposed on a surface of a device die.

Device package 100 includes a vertical stack 101 of a spacer block 120 coupled to a device die 110 by an adhesive layer 113. Heat flows from device die 110 through the spacer block 120 are depicted, for example, by arrows 190, 190p, 190s, 192g, and 192 (generally perpendicular to the die). Device die 110 may have large area contact pads (e.g., emitter contact pads) disposed in a region 110A of the die, and small area device contact pads (e.g., signal sense contact pads) disposed in a region 110B of the die 110 (FIG. 1B).

Spacer block 120 may include a first region (smooth region 121) with a smooth (flat) horizontal surface 124 and a second region (patterned region 122) with a patterned (non-flat) horizontal surface 126. Spacer block 120 in smooth region 121 may have a thickness T, and in patterned region 122 may having thicknesses alternating between T and T-ΔT, for example, according to a pattern of grooves and pillars 123 in patterned region 122. The grooves and pillars (e.g., grooves 123a and pillars 123b) in the pattern may have a height or thickness ΔT. Each of pillars 123 may have a surface (e.g., a top surface contact area 125) presented for bonding to die 110. In some implementations, the grooves can be broadly referred to as recesses and the pillars can be broadly referred to as protrusions.

In vertical stack 101, spacer block 120 presents all of the area of horizontal surface 124 of the spacer block in smooth region 121 for contacting and bonding to a corresponding region 110A of device die 110. Heat flow (depicted by arrow 190s in FIG. 1A) from the die can conduct across all of horizontal surface 124 of smooth region 121 into spacer block 120.

Patterned region 122 may have a nominal horizontal surface area (e.g., the surface area if patterned region 122 were to have a smooth or flat surface like smooth region 121) for patterned horizontal surface 126 (in other words, patterned region 122 has a nominal horizontal surface area equal to the area of a flat surface region having a same horizontal size as patterned region 122). However, because of grooves 123a (e.g., gaps, recesses) present in patterned horizontal surface 126, not all of the nominal horizontal surface area can be presented by patterned region 122 for contacting, or bonding to, device die 110. Grooves 123a may not present any surface area for contacting, or bonding to, device die 110. Patterned region 122 of the spacer block may present only the top surface areas, (e.g., top surface contact area 125) of pillars 123b in the patterned region for contacting, or bonding to, a corresponding region 110B of device die 110. The top surface areas of pillars 123b presented for bonding may be only a fraction of the nominal horizontal surface area. The fraction may, for example, be proportional to a ratio: (sum of cross-sectional areas of pillars 123b)/(sum of cross-sectional areas of pillars+sum of cross-sectional areas of grooves 123a)

Heat flow (depicted by arrows 190p in FIG. 1A) from the die into spacer block 120, after crossing surface contact areas 125, is conducted vertically through pillars 123b into spacer block 120. There may be no heat flow from the die conducted into spacer block 120 across patterned horizontal surface 126 through grooves 123a (gaps). Grooves 123a (which can be gaps (e.g., air gaps)) may interfere (or partially r interfere with heat flow from the die into spacer block 120, and may limit heat flow from the die into spacer block 120 to the heat flow (depicted by arrows 190p) through surface contact areas 125 of pillars 123b.

A rate of heat flow (e.g., heat flow depicted by arrows 190p) from the die through spacer block 120 in region 122 may be reduced by the limited contact areas (e.g., surface contact areas 125 of pillars 123b) available for contacting, or bonding to, the die. The rate of heat flow may be reduced to be lower than the rate of heat flow through a solid spacer block that does not have the pillars and grooves (e.g., like region 121 of spacer block 120, heat flow depicted by arrow 190s) and has all of the nominal horizontal surface area of patterned horizontal surface 126 available for contacting, or bonding to, the die. The reduced rate of heat flow due to the limited contact areas may still be adequate to meet the thermal cooling requirements of the device.

As shown in FIG. 1A, vertical stack 101 may be disposed, for example, between DBC substrate 140 and DBC substrate 180. Substrate 140 and substrate 180 may, for example, include dielectric layers (e.g., ceramic layer, polymer layer) 141 and 181 that are plated, coated, or printed, on both sides, with metal or other electrically conductive material layers (e.g., conductive layer 142, conductive layer 182). Dielectric layers 141 and 181 may be made from electrically insulating, but thermally conductive materials (e.g., Zr-doped alumina). In some implementations, conductive layer 142 and conductive layer 182 may be, or can include, a copper layer.

Vertical device stack 101 (including spacer block 120 and die 110) may be coupled (e.g., bonded) on one side to substrate 140 and on another side to device die 110. For example, spacer block 120 may be coupled on one side to substrate 180 (e.g., by adhesive layer 112) and (as previously noted) on another side to device die 110 using adhesive layer 113. Device die 110 (e.g., an IGBT device) may be coupled to substrate 140, for example, in a flip chip configuration, by adhesive layer 114. For dual-side cooling, on one side, heat may flow from die 110 through spacer block 120 and substrate 140 to outside of the package (e.g., as depicted in FIG. 1A by vertically upward arrow 190) from die 110 through spacer block, and on the second side, heat may flow from die 110 through substrate 140 to outside of the package (e.g., as depicted in FIG. 1A by vertically downward arrows 192).

The rate of heat flow from device die 110 to outside of package 100 through substrate 140 may depend on a thermal path through ceramic layers 141 and conductive layers 142. In example implementations, the thermal path may be modified of changed, for example, by introducing a recess (e.g., a gap, a groove 140G) to interfere with heat flow (e.g., heat flow depicted by arrow 192g) in the outer conductive layer 142 of substrate 140, in accordance with the principles of the present disclosure.

In example implementations, a recess (e.g., a gap, a groove 140G) may be disposed in outer conductive layer 142 of substrate 140 across from the surface region (e.g., region 110B) of the device die that includes one or more other signal sense contact pads (FIG. 1B). The recess (e.g., groove 140G) may reduce the CTE mismatch between the two sides of DBC and thus reduce the warpage, in accordance with the principles of the present disclosure. The interference presented by the recess (e.g., groove 140G) may reduce the rate of heat flow (e.g., heat flow depicted by arrow 192g) from device die 110 to outside of package 100 through outer conductive layer 142 of substrate 140. However, the reduced rate of heat flow can still meet the thermal requirements of the power device.

FIG. 1B shows device die 110 with an example layout 100A of device contact pads disposed on a surface 11S of the device die (which is bonded to substrate 140). In example implementations, device die 110 may, for example, include an IGBT device. Device die 110 may have a generally square or rectangular shape with a length L and a width W. The dimensions of each side of the die may be in a range of several millimeters. For example, W may be in a range of 10 to 20 millimeters, and L may also be in a range of 10 to 20 millimeters.

Layout 100A includes an arrangement of emitter contact pads (e.g., pads 101-1, 101-2, 101-3, 101-4), and one or more other signal sense contact pads (e.g., collector sense (CS) pad 102, emitter sense (ES) pad 103, gate (G) pad 104, temperature sense (TS) pad 105, temperature anode (TA) pad 106, pad 107, etc.).

The emitter contact pads (e.g., pads 101-1, 101-2, 101-3, 101-4) may be disposed on a surface 11S in a region 110A of the die. Region 110A may have an area ~W1*L. Region 110A (in which emitter contact pads 101-1, 101-2, 101-3, and 101-4 are disposed) may occupy a substantial portion of a total area (e.g., ~W*L) of surface 11S. Each of the emitter contact pads may occupy an area (e.g., ~X*Y) in region 110A with each emitter pad (e.g., pads 101-1, 101-2, 101-3, 101-4) having a length ~x and a width ~Y. In example implementations, region 110A may have an area of about X=11.90 millimeters by Y=14.0 millimeters.

In layout 100A, an arrangement of the one or more other signal sense contact pads (e.g., CS pad 102, ES pad 103, gate pad 104, TS pad 105, TA pad 106, pad 107 etc.) may be disposed on surface 11S in a region 110B of the die alongside an edge 11E (e.g., between a first corner portion Aa and a second corner portion Bb of the die. Region 110B may have a width W2 perpendicular to edge 11E and a length L along edge 11E. In example implementations, region 110B may have width W2 in a range of a few millimeters (e.g., 1 millimeter to 5 millimeters).

Corner portions (e.g., corner portion Aa and corner portion Bb) of the die (end portions of region 110B) may or may not include any device contact pads.

In example implementations, each of the one or more other signal sense contact pads may have similar shapes (e.g., a circular, oval or rectangular shape). In FIG. 1B, the one or more other signal sense contact pads are shown, for example, as having a generally rectangular shape with a pad width pw and a pad length pl. In example implementations, the signal sense contact pads may be a few millimeters in size (e.g., pw=1.3 millimeters and pl=1.0 millimeter).

In device operation, region 110A (including the arrangement of emitter contact pads) may generate a different level of heat (e.g., higher) than a level of heat generated by region 110B (including the arrangement of the signal sense contact pads). Further, corner portions of the die (e.g., corner portion Aa and corner portion Bb), which may or may not include contact pads, may run cooler than other portions of the die.

With reference to FIG. 1A, in device package 100, region 121 of spacer block 120 (having thickness T) may be aligned with region 110A of device die 110, and patterned region 122 of spacer block 120 (having alternating pillars and grooves in the patterned region) may be aligned with region 110B (having the one or more other signal sense contact pads) of device die 110.

A spacer block with a patterned region presenting a limited contact area for contacting a die may be referred to herein as a patterned spacer block. A patterned spacer block may be customized for a particular device die (e.g., device die 110) and the particular contact pads layout of the device die (e.g., layout 100A, FIG. 1B) to be enclosed in a device package.

The patterned spacer block may effectively reduce the thermal mismatches between components of device package 100 due to the different coefficient of thermal expansion (CTE) of materials under the modified heat flow rates. The reductions in the thermal mismatches may reduce CTE mis-match stress on the die and avoid issues with die crack formation. In particular, patterned region 122 of spacer block 120 (having alternating pillars and grooves in the patterned region) aligned with region 110B (having the one or more other signal sense contact pads) of the device die may reduce the stress on 110B region of the die.

FIGS. 2A through 9B shows example patterned spacer blocks (e.g., patterned spacer blocks 200, 300, 400, 500, 600, 700, 800, and 900) that may be customized for use with particular devices in dual-side cooled device packages.

Figure 2A:
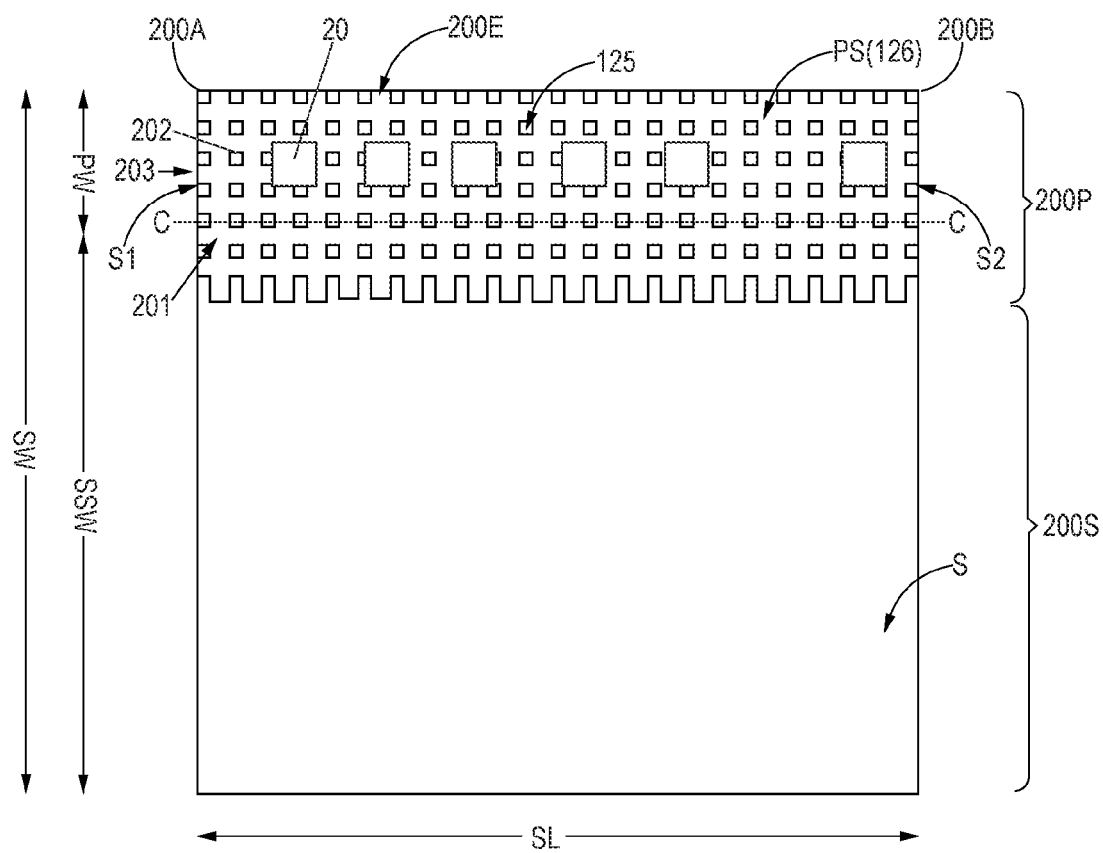
FIGS. 2A through 9B show example patterned spacer blocks that can be customized for use with particular devices in dual-side cooled device packages.
Figure 2B:
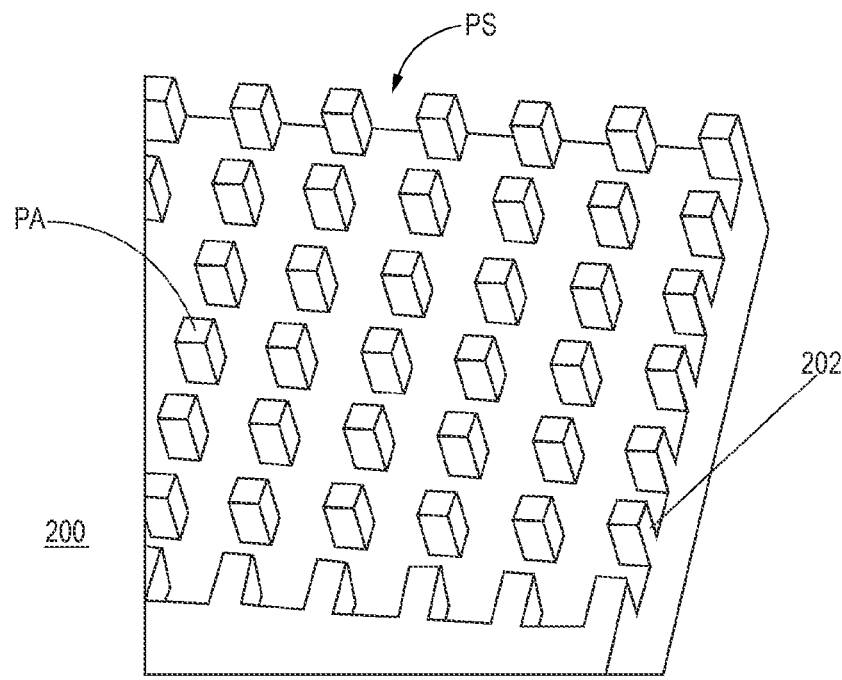
Figure 2C:
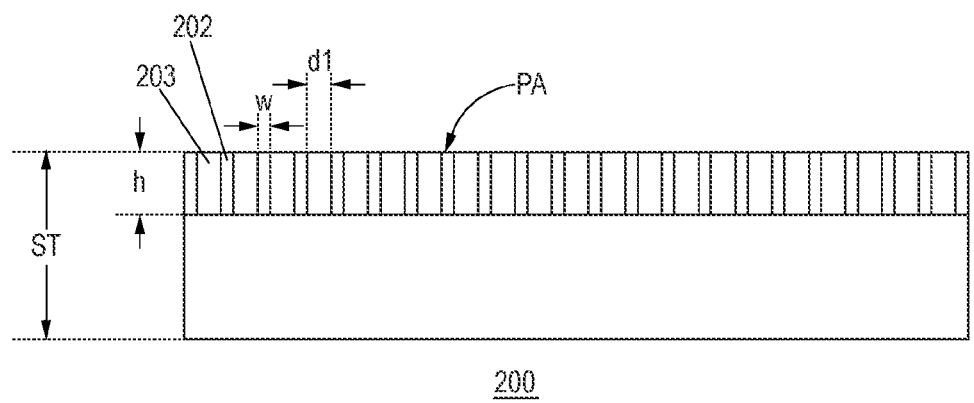

FIG. 2A shows a plan view of an example patterned spacer block 200. FIG. 2B shows perspective view of a portion of spacer block 200. FIG. 2C shows a cross-sectional view of spacer block 200 taken along line C-C in FIG. 2A.

Patterned spacer block 200 may be made of metal (e.g., copper or other metal, or metal alloy). Patterned spacer block 200 may, for example, be a rectangular block with a length SL and a width SW (FIG. 2A), and a thickness ST (FIG. 2C).

Patterned spacer block 200 may include two regions, i.e., a region 200S and a patterned region 200P. Region 200S may be a rectangular region having, for example, a length SL and a width SSW. Region 200S may have a smooth (i.e., flat and un-patterned) surface (e.g., surface S).

Patterned region 200P may be a rectangular region between a first side (side 51) and a second side (side S2) of patterned spacer block 200. Patterned region 200P may have, for example, a length SL and a width PW. Patterned region 200P may extend in length along an edge 200E between a first corner (corner 200A) and a second corner (corner 200B) of spacer block 200. Patterned region 200P may have a patterned surface (e.g., surface PS). Surface PS may be a non-flat or non-smooth surface.

Patterned surface PS may, for example, include an array of pillars (e.g., array 201 of pillars 202). Pillars 202 may be structures formed, for example, by etching grooves 203 (FIG. 2C) in the metal (e.g., in sheet metal) that spacer block 200 may be made of. Pillars 202 may have a height h and a width w. Pillars 202 may have horizontal cross-sectional areas of any shape (e.g., round, square, rectangular, hexagonal, etc.). In example implementations, pillars 202 may have a square cross-sectional area PA, and may be spaced a distance dl apart by grooves 203. Patterned region 200P (with the pillars and grooves) may have a patterned surface (e.g., surface PS) with a nominal horizontal surface area (in other words, an area as if patterned region 200P were a flat or smooth surface).

Patterned spacer block 200 may be customized for use with a particular device die (e.g., device die 110, FIG. 1B) in a device package. For example, sizes and orientations of region 200S and patterned region 200P of patterned spacer block 200 may be adapted to be coupled (e.g., bonded) to region 110B and region 110A of device die 110 (FIG. 1B) in a dual side cooled device package (e.g., package 100, FIG. 1A). For visual comparison of the relative dimensions the device die and spacer block dimensions, an example array of signal sense contact pads 20 of the device die is overlaid on patterned spacer block 200 shown in FIG. 2A.

In example implementations, patterned spacer block 200 may have a width SW in a range of 10 to 20 millimeters, a length SL in a range of 10 to 20 millimeters and a thickness ST in a ranges of 1 to 5 millimeters (e.g., SW=17 millimeters, SL=17 millimeters, ST=1.5 millimeters.) Pillars 202 in patterned region 200P may have a height h in a range of 0.2 to 1 millimeter, and a width w in a range of 0.1 to 1 millimeter, and a rectangular or square cross-sectional area PA (e.g., h=0.50 millimeters, width w=0.25 millimeters, and a square cross-sectional area PA≈w*w=0.25*0.25 millimeters). The spacing distance dl between pillars 202 (i.e., a width of grooves 203) may be in a range of 0.2 to 2 millimeters (e.g., dl=0.75 millimeters). Each pillars 202 may present only a fraction (e.g., ≈area PA/(area of surrounding groove≈dl*dl) of the nominal surface area of patterned region 200P as contact area for bonding the die. In example implementations, the fraction may be in a range of about ½₀ to ½ (e.g., (0.25*0.25 millimeters)/(0.75*0.75 millimeters) =⅑).

Figure 3A:
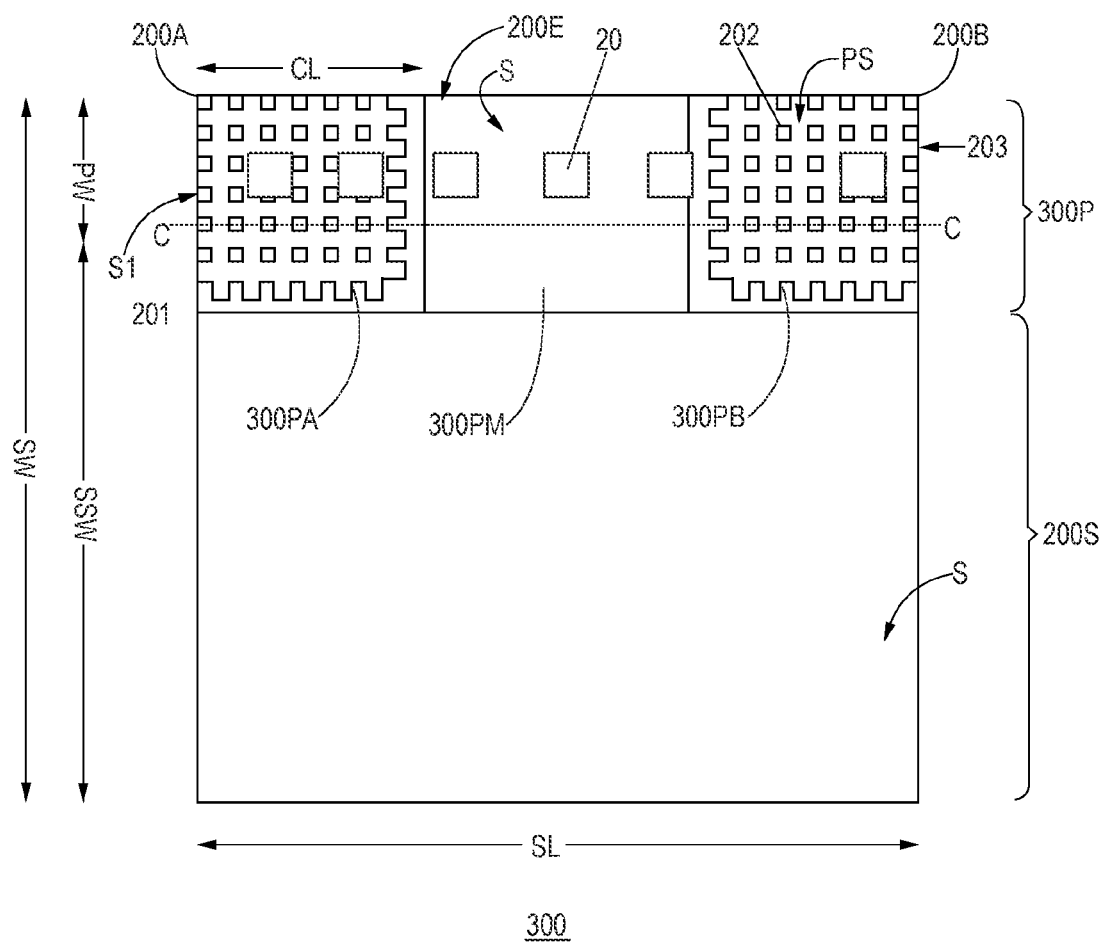
Figure 3B:
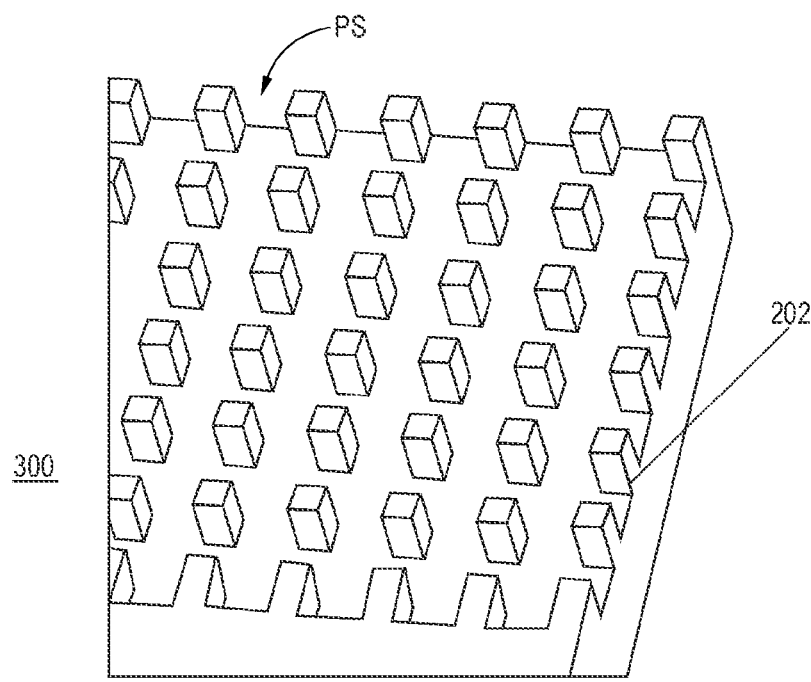
Figure 3C:
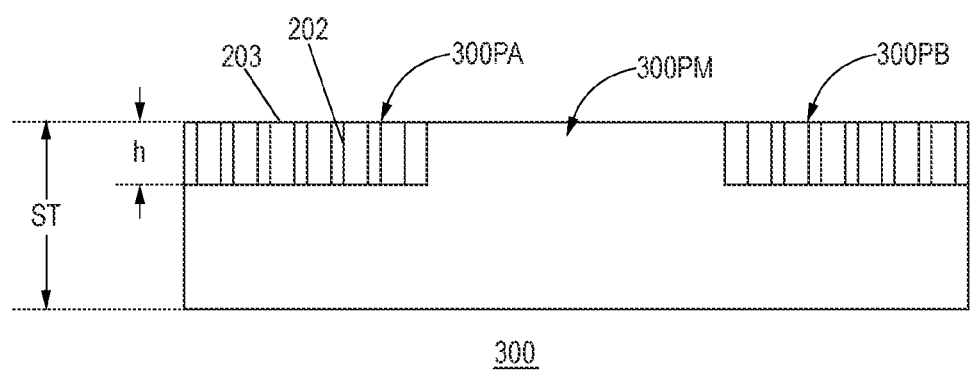

FIG. 3A shows a plan view of an example patterned spacer block 300. FIG. 3B shows perspective view of a portion of spacer block 300. FIG. 3C shows a cross-sectional view of spacer block 300 taken along line C-C in FIG. 3A.

Patterned spacer block 300, like patterned spacer block 200 (FIG. 2A), may be made of metal (e.g., copper or other metal, or metal alloy). Patterned spacer block 300 may, for example, be a rectangular block with a length SL and a width SW, and a thickness ST (FIG. 3C).

Patterned spacer block 300 may include two regions, i.e., a region 200S and a patterned region 300P. Like patterned region 200S (FIG. 2A), patterned region 300P may be a rectangular region having, for example, a length SL and a width PW. Patterned region 300P may include a corner region 300PA, a middle region 300PM, and a corner region 300PB. Middle region 300Pm may have a smooth surface (e.g., surface S, like region 200S). Corner regions 300PA and 300PB may, for example, be square or rectangular regions (having lengths CL and widths PW). Corner regions 300PA and 300PB may have patterned surfaces (e.g., surface PS) including, for example, pillars 202 and grooves 203.

Patterned spacer block 300 may be customized for use with a particular device die (e.g., device die 110, FIG. 1B) in a device package. For example, sizes and orientations of region 200S and patterned region 300P of patterned spacer block 200 may be adapted to be coupled (e.g., bonded) to region 110B and region 110A of device die 110 (FIG. 1B) in a dual side cooled device package (e.g., package 100, FIG. 1A). For visual comparison of the relative dimensions the device die and spacer block dimensions, the example array of signal sense contact pads 20 of the device die is overlaid on patterned spacer block 300 shown in FIG. 3A.

In example implementations, patterned spacer block 300 may have a width SW in a range of 10 to 20 millimeters, a length SL in a range of 10 to 20 millimeters and a thickness ST in a ranges of 1 to 5 millimeters (e.g., SW=17 millimeters, SL=17 millimeters, ST=1.5 millimeters). Corner region 300PA and corner region 300PB may have lengths CL in a ranges of 2 to 6 millimeters and widths PW in a ranges of 2 to 6 millimeters (e.g., CL=5 millimeters and PW=5 millimeters). Pillars 202 in corner region 300PA and corner region 300PB may have a height h in a range of 0.2 to 1 millimeter, and a width w in a range of 0.1 to 1 millimeter, and a rectangular or square cross-sectional area PA (e.g., h=0.50 millimeters, width w=0.25 millimeters, and a square cross-sectional area PA≈w*w=0.25*0.25 millimeters). The spacing distance dl between pillars 202 (i.e., a width of grooves 203) may be in a range of 0.2 to 2 millimeters (e.g., dl=0.75 millimeters).

Figure 4A:
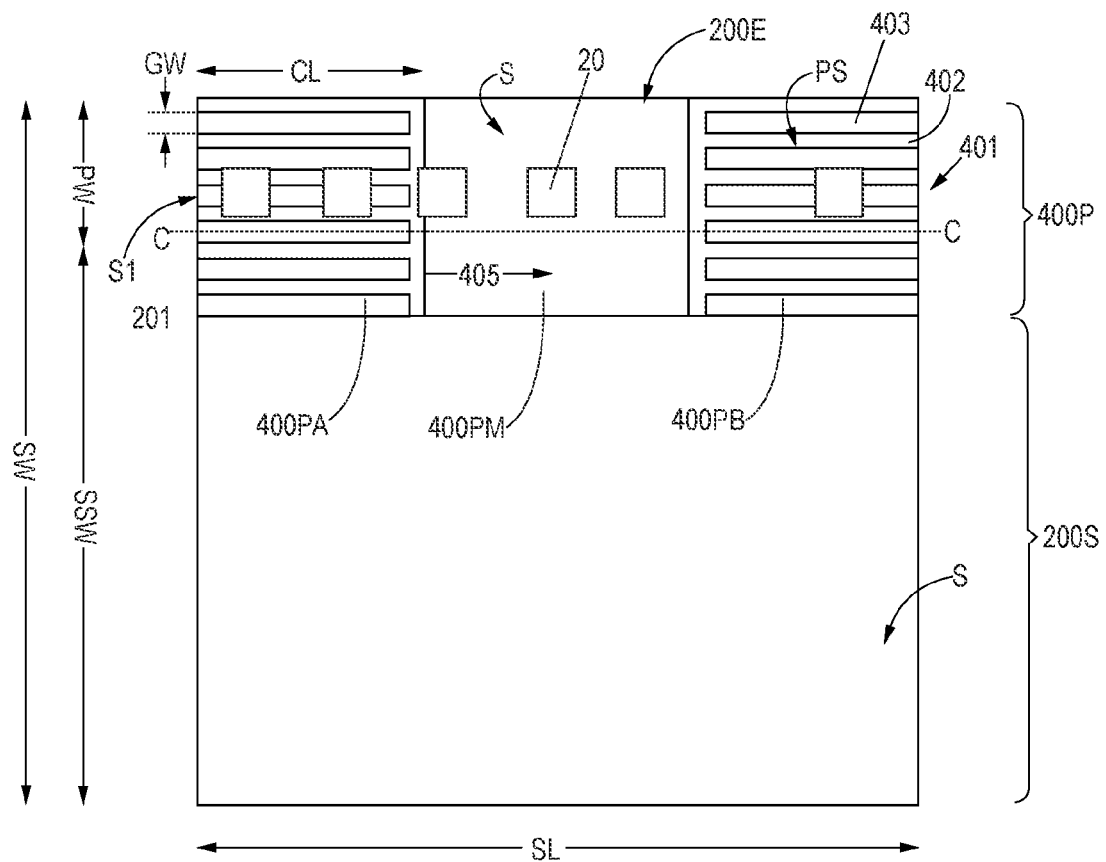
Figure 4B:
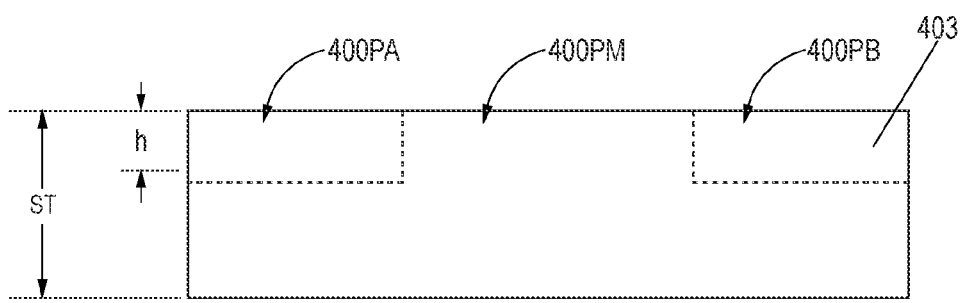

FIG. 4A shows a plan view of an example patterned spacer block 400. FIG. 4B shows a cross-sectional view of spacer block 400 taken along line C-C in FIG. 4A.

Patterned spacer block 400, like patterned spacer block 200 (FIG. 2A) and patterned spacer block 300 (FIG. 3A), may be made of metal (e.g., copper or other metal, or metal alloy). Patterned spacer block 400 may, for example, be a rectangular block with a length SL and a width SW, and a thickness ST (FIG. 4B).

Patterned spacer block 400 may include two regions, i.e., a region 200S and a patterned region 400P. Like patterned region 300P (FIG. 3A), patterned region 400P may be a rectangular region having, for example, a length SL and a width PW. Patterned region 400P (like patterned region 300P) may include a corner region 400PA, a middle region 400PM, and a corner region 400PB. Middle region 400PM may have a smooth surface (e.g., surface S, like region 200S). Corner regions 400PA and 400PB may, for example, be square or rectangular regions (having lengths CL and widths PW). Corner regions 400PA and 400PB may have patterned surfaces (e.g., surface PS) including, for example, an arrangement of recesses and protrusions 401. The recesses may be grooves (e.g., grooves 403), and the protrusions may be mesas (e.g., mesas 402). The arrangement of recesses and protrusions 401 may include a number of grooves 403 and a number of mesas 402 (instead of the pillars 202 shown in patterned region 300P). Grooves 403 may have a width GW and a depth h. Mesas 402 may have a width w (like pillar 202, FIG. 2C) and a height h. Grooves 403 and mesas 402 may extend longitudinally along the lengths CL (in other words, grooves 403 and mesas 402 may be parallel to CL). The mesas and grooves may be aligned parallel to a longitudinal direction 405 from the first corner portion to the second corner portion of the spacer block. The mesas can be types of protrusions.

Patterned spacer block 400 may be customized for use with a particular device die (e.g., device die 110, FIG. 1B) in a device package. For example, the sizes and orientations of region 200S and patterned region 400P of patterned spacer block 400 may be adapted to be coupled (e.g., bonded) to region 110B and region 110A of device die 110 (FIG. 1B) in a dual side cooled device package (e.g., package 100, FIG. 1A). For visual comparison of the relative dimensions the device die and spacer block dimensions, the example array of signal sense contact pads 20 of the device die is overlaid on patterned spacer block 300 shown in FIG. 3A.

In example implementations, patterned spacer block 400 may have a width SW in a range of 10 to 20 millimeters, a length SL in a range of 10 to 20 millimeters and a thickness ST in a ranges of 1 to 5 millimeters (e.g., SW=17 millimeters, SL=17 millimeters, ST=1.5 millimeters.) The number of grooves 403 and mesas 402, for example, in each of corner region 400PA and corner region 400PB, may be between 4 and 10 (e.g., six). Grooves 403 and mesas 402 in patterned region 400P may have a depth or height h in a range of 0.2 to 1 millimeter (e.g., 0.5 millimeters) (FIG. 4B). Grooves 403 may have a width GW in a range of 0.25 to 2 millimeters (e.g., 0.5 millimeters). Mesas 402 (like pillars 202 in spacer block 200) may have a width of about 0.25 millimeters.

In the example spacer block 400 shows in FIGS. 4A and 4B, grooves 403 and mesas 402 are shown as extending longitudinally along the lengths CL of corner regions 400PA and 400PB (i.e., parallel to longitudinal direction 405 from the first corner portion to the second corner portion of the spacer block). In other implementations, grooves 403 and mesas 402 may extend vertically along the widths PW of the corner regions 400PA and 400PB (i.e., perpendicular to longitudinal direction 405 from the first corner portion to the second corner portion of the spacer block).

Figure 5A:
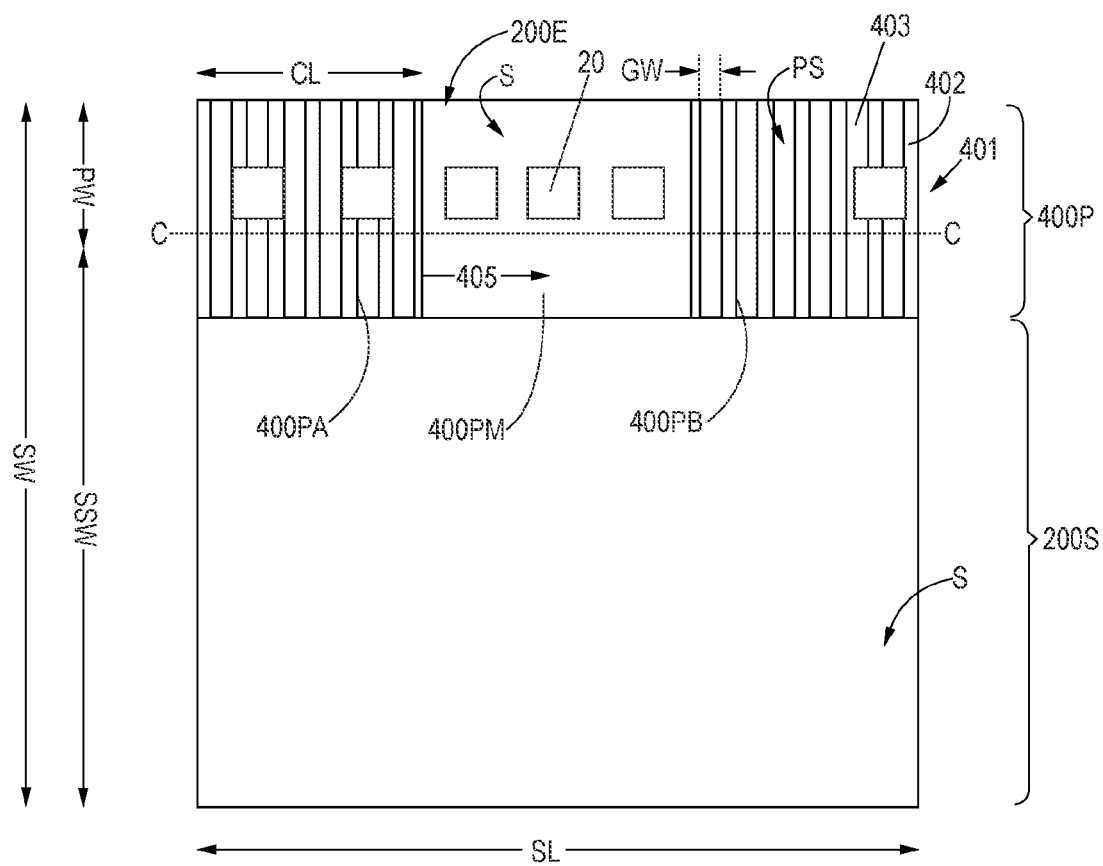
Figure 5B:
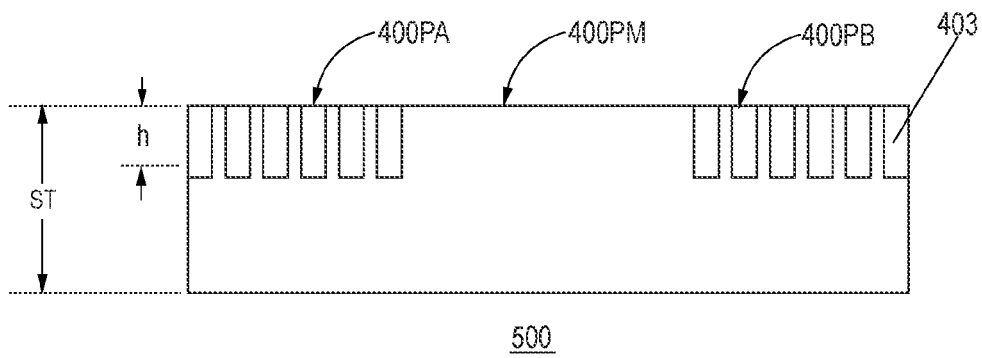

FIG. 5A shows an example patterned spacer block 500 in which grooves 403 and mesas 402 extend along the widths PW of the corner regions 400PA and 400PB (in other words, grooves 403 and mesas 402 may be parallel to PW and perpendicular to the longitudinal direction from the first corner portion to the second corner portion of the spacer block). FIG. 5B shows a cross sectional view of patterned spacer block 500 taken along line C-C in FIG. 5A.

FIGS. 2A through 5B (discussed above) show patterned spacer blocks (e.g., patterned spacer blocks 200, 300, 400 and 500) in which reductions of the CTE mismatch between the die and the spacer blocks are obtained by using grooves on the surface of the patterned spacer blocks.

FIGS. 6A through 9B show patterned spacer blocks (e.g., patterned spacer blocks 600, 700, 800 and 900) in which reductions of the CTE mismatch between the die and the patterned spacer region 600P are obtained by introducing cavities inside the patterned spacer blocks. The reductions of the CTE mismatch can avoid issues with die crack formation due to the CTE mismatch stress.

Figure 6A:
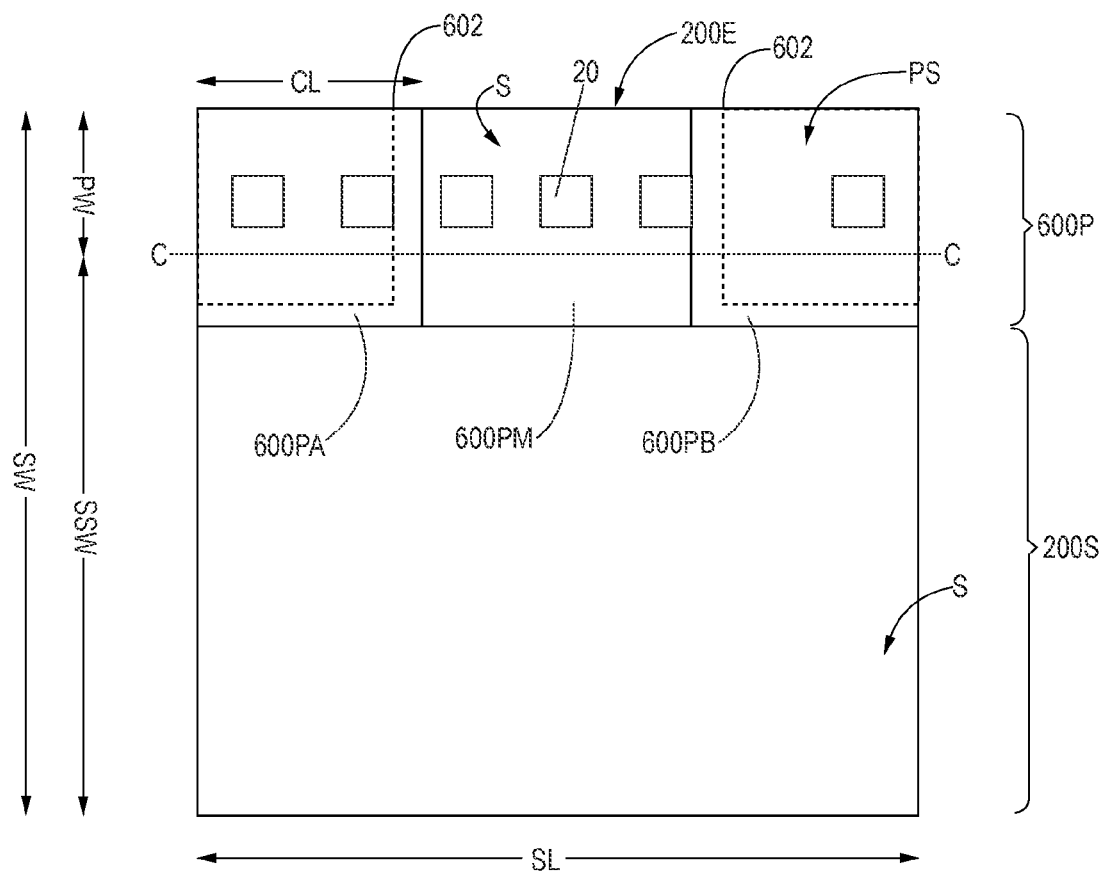
Figure 6B:
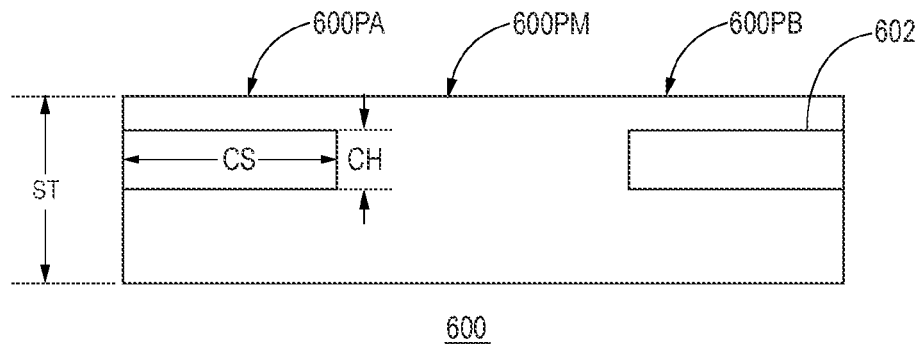

FIG. 6A shows a plan view of an example patterned spacer block 600. FIG. 6B shows a cross-sectional view of spacer block 600 taken along line C-C in FIG. 6A.

Patterned spacer block 600, like patterned spacer block 200 (FIG. 2A) and patterned spacer block 300 (FIG. 3A), may be made of metal (e.g., copper or other metal, or metal alloy). Patterned spacer block 600 may, for example, be a rectangular block with a length SL and a width SW, and a thickness ST (FIG. 6B).

Patterned spacer block 600 may include two regions, i.e., a region 200S and a patterned region 400P. Like patterned region 300P (FIG. 3A), patterned region 600P may be a rectangular region having, for example, a length SL and a width PW. Patterned region 600P (like patterned region 300P) may include a corner region 600PA, a middle region 600PM, and a corner region 600PB. Middle region 400PM may have a smooth surface (e.g., surface S, like region 200S). Corner regions 600PA and 600PB may, for example, be square or rectangular regions (having lengths CL and widths PW). Corner regions 600PA and 600PB may have smooth surfaces (e.g., surface S, like region 200S).

Recesses (e.g., a cavity 602) may be disposed in spacer block 600 underneath or below each of corner regions 600PA and 600PB in order to reduce the CTE mismatch around the die corners.

In example implementations, cavity 602 may have a rectangular or square box-like shape with side lengths CS and a height CH (FIG. 6B).

Patterned spacer block 600 may be customized for use with a particular device die (e.g., device die 110, FIG. 1B) in a device package. For example, sizes and orientations of region 200S and patterned region 600P of patterned spacer block 600 may be adapted, for example, to be coupled (e.g., bonded) to region 110A and region 110B of device die 110 (FIG. 1B) in a dual side cooled device package (e.g., package 100, FIG. 1A). For visual comparison of the relative dimensions the device die and spacer block dimensions, the example array of signal sense contact pads 20 of the device die is overlaid on patterned spacer block 600 shown in FIG. 6A.

In example implementations, patterned spacer block 600 may have a width SW in a range of 10 to 20 millimeters, a length SL in a range of 10 to 20 millimeters and a thickness ST in a range of 1 to 5 millimeters (e.g., SW=17 millimeters, SL=17 millimeters, ST=1.5 millimeters.)

In example implementations, cavity 602 (disposed in patterned spacer block 600 underneath surface PS of corner regions 600PA and 600PB) may be a square-box with a side length CS in a range of 2 to 20 millimeters (e.g., 2 millimeters), and a height CH in a range of 0.2 to 1 millimeter (e.g., 0.5 millimeters).

In the example spacer block 600 shown in FIGS. 6A and 6B, the recess placed underneath or below surface PS of each of corner regions 600PA and 600PB is shown as a single cavity 602 having a square box-like shape. In other implementations, other shapes and configurations of the recesses may be used (e.g., as shown in FIGS. 7A through 9B).

Figure 7A:
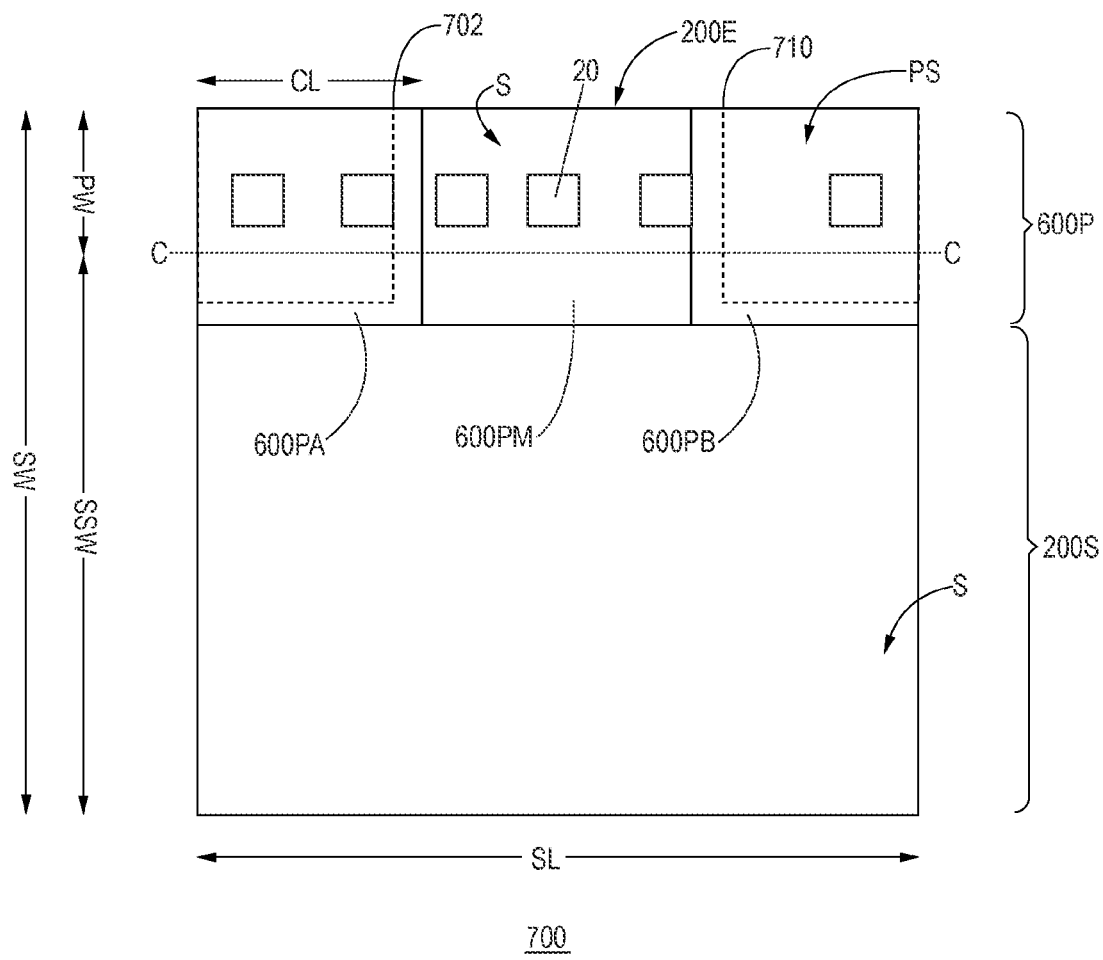

FIG. 7A shows an example patterned spacer block 700 in which the recesses placed underneath or below surface PS of each of corner regions 600PA and 600PB is a vertical stack 710 of a number n of cavities 702 (e.g., n=2). FIG. 7B shows a side perspective view of a portion of patterned spacer block 700. FIG. 7C shows a cross sectional view of patterned spacer block 700 taken along line C-C in FIG. 7A.

In example implementations, cavities 702 (like cavities 602, FIG. 6B) may have a rectangular or a square box-like shape with a side width CW and a cavity height CH. In example implementations, a number of cavities in stack 710 may between 2 and 10 (e.g., 2). Cavities 702 (like cavities 602, FIG. 6B) may have a rectangular or a square box-like shape. In example implementations, cavity 702 may be a square box with a side length CS in a range of 2 to 20 millimeters (e.g., 2 millimeters), and a height CH in a range of 0.2 to 1 millimeter (e.g., 0.375 millimeters).

Figure 8A:
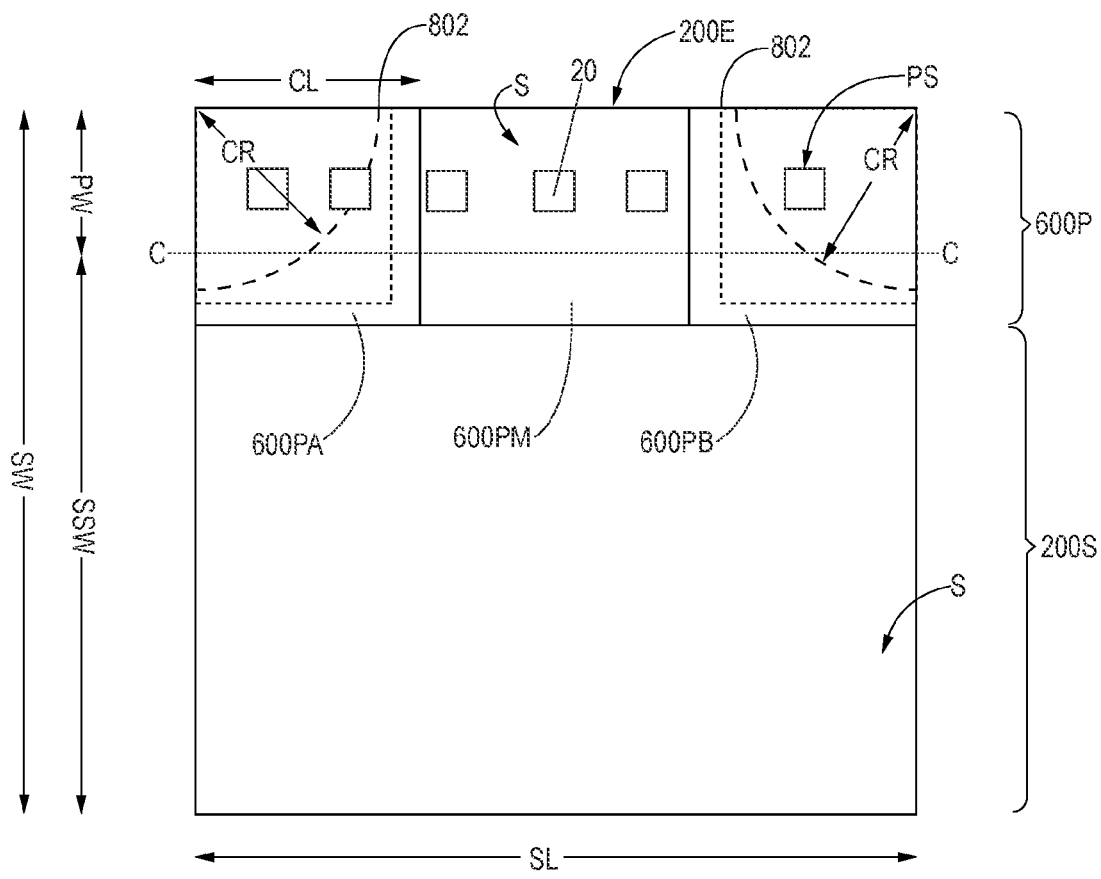
Figure 8B:
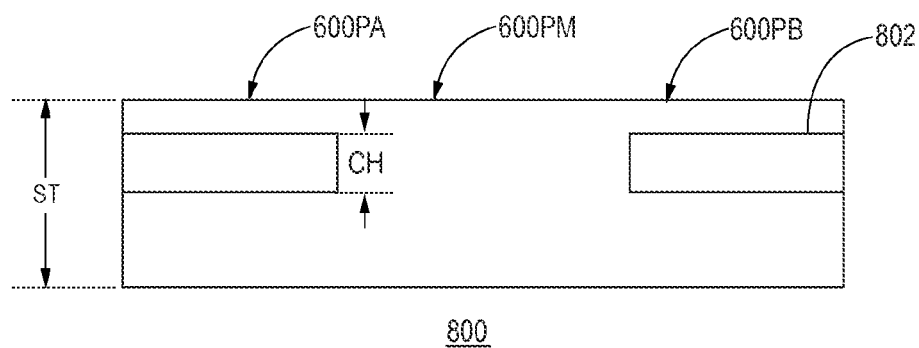

FIG. 8A shows an example patterned spacer block 800 in which the recess placed underneath surface PS of each of corner regions 600PA and 600PB is a circular cavity 802. FIG. 8B shows a cross sectional view of patterned spacer block 800 taken along line C-C in FIG. 8A.

In example implementations, circular cavity 802 may have a pie-shape box-like shape with a radius CR and a cavity height CH. In example implementations, radius CR may be in a range of 2 to 5 millimeters (e.g., 2 millimeters), and a height CH in a range of 0.2 to 1 millimeter (e.g., 0.375 millimeters).

Figure 9A:
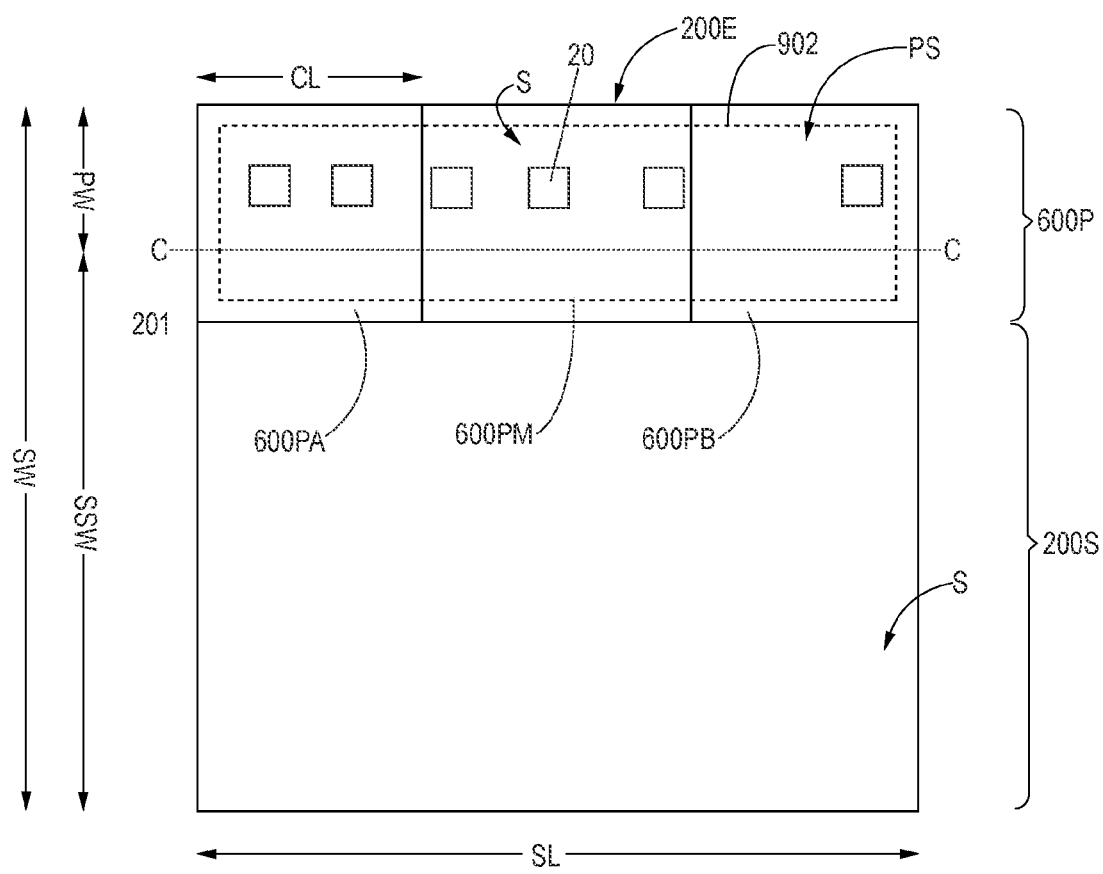
Figure 9B:
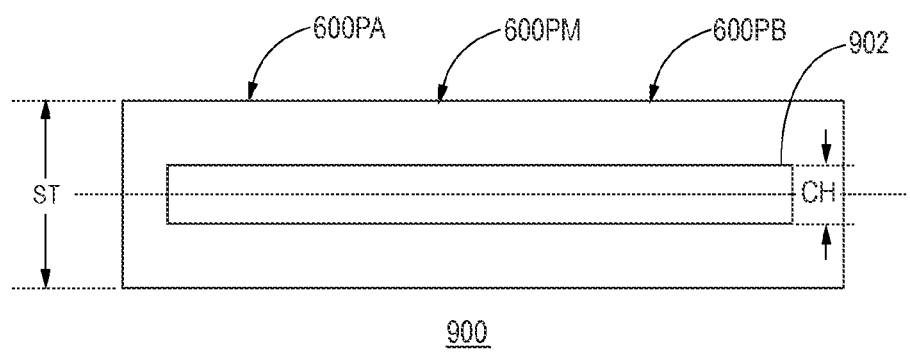

FIG. 9A shows an example patterned spacer block 900 in which the recess placed underneath surface PS of each of corner regions 600PA and 600PB is a rectangular box-like cavity 902 extending from corner region 600PA across region 600PM into corner region 600PA. FIG. 9B shows a cross sectional view of patterned spacer block 900 taken along line C-C in FIG. 9A.

In example implementations, rectangular box-like cavity 902 may have a rectangular box shape with a length CL and a cavity height CH. In example implementations, length CL may be in a range of 3 to 20 millimeters (e.g., 14 millimeters), and a height CH may be in a range of 0.2 to 1 millimeter (e.g., 0.5 millimeters).

As noted previously, the rate of heat flow (heat flow depicted by vertically downward arrow 192) from device die 110 through substrate 140 to outside of package 100 may depend on a thermal path (resistance) through ceramic layers 141 and conductive layers 142 of substrate 140. In example implementations (shown in FIG. 1A), the thermal path may be modified of changed, for example, by introducing a groove or an arrangement of grooves (e.g., a groove 140G, FIG. 1A) in the outer conductive layer 142 of substrate 140) to reduce the CTE mismatch and the warpage of DBC.

A substrate with recesses in a path of heat flow from an attached device die (e.g., die 110) through the substrate may be referred to herein as a grooved substrate. The grooved substrate may be customized for a particular device die (e.g., device die 110) and a particular device contact pads layout of the device (e.g., layout 100A, FIG. 1B) to be enclosed in a device package.

FIGS. 10A, 10B, 11, and 12 show example grooved substrates (e.g., grooved substrates 1000, 1100, and 1200) that may be customized for use with particular device dies in dual-side cooled device packages.

Figure 10A:
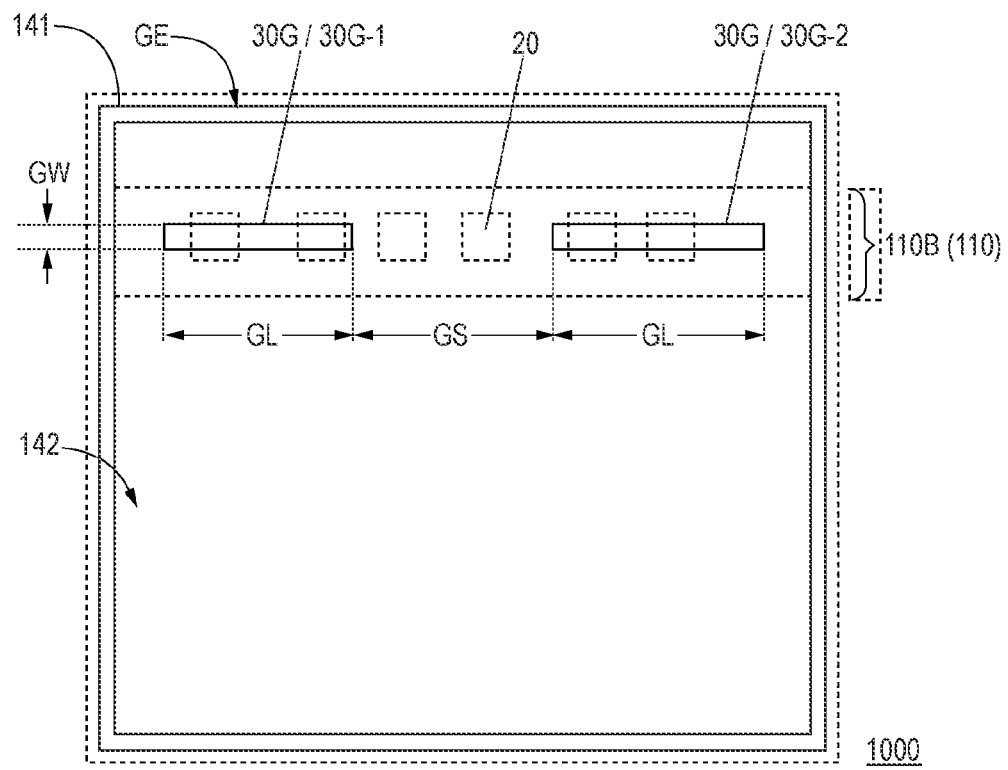
FIGS. 10A, 10B, 11, and 12 show example grooved substrates that can be customized for use with particular device dies in dual-side cooled device packages.
Figure 10B:
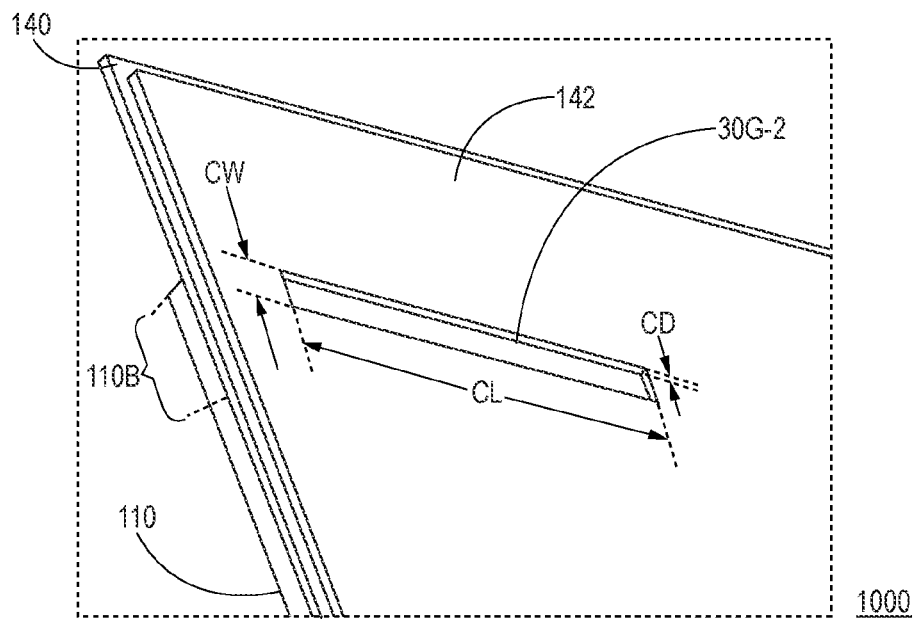

FIG. 10A shows, in plan view, a grooved substrate 1000. FIG. 10B shows a side perspective view of a grooved substrate 1000 with a die (e.g., die 110) attached to one side of the substrate (as in FIG. 1A).

Like substrate 140 (FIG. 1A), grooved substrate 1000 may, for example, include a dielectric layer (e.g., ceramic layer, polymer layer) 141 that is plated, coated, or printed, on both sides, with copper or other electrically conductive material layers (e.g., conductive layer 142). In example implementations, conductive layer may have a thickness in a range of about 0.2 to 1 millimeter (e.g., 0.4 millimeters).

Grooved substrate 1000 may include an arrangement of grooves 30G including, for example, two grooves: groove 30G-1 and groove 30G-2, formed in conductive layer 142 (e.g., on a side opposite to the side attached to the die). The grooves may reduce the CTE mismatch and the warpage of DBC, and therefore reduce the bending deformation of device die 110 due to the warpage of DBC.

Grooves 30G-1 and 30G-2 may have a length GL, a width GW and a depth GD. Length GL may be in a range of 5 to 50 millimeter (e.g., 13 millimeters), width GW may be in a range of 5 to 20 millimeter (e.g., 1.3 millimeters), and depth GD may in a range of 0.05 to 1 millimeter (e.g., 0.1 millimeters, or 0.2 millimeters).

In example implementations, grooves 30G-1 and groove 30G-2 may be aligned, with each other along their lengths GL. Grooves 30G-1 and groove 30G-2 may be placed, for example, a separation distance Gsep apart, on an horizontal axis parallel to an edge GE of grooved substrate 1000. In example implementations, the separation distance Gsep may be in a range of 10 to 100 millimeters (e.g., 50 millimeters).

The positions of grooves 30G-1 and groove 30G-2 in grooved substrate 1000 may be based on consideration of the dimensions of the device die (e.g., device die 110, FIG. 1B) and of region 110B of the die that includes the signal sense contact pads (e.g., CS pad 102, ES pad 103, gate pad 104, TS pad 105, TA pad 106, pad 107 etc.) of the die (FIG. 1B). For an example visual comparison of the relative dimensions of the die and grooves 1002-1 and groove 1002-2 an example array of signal sense contact pads 20 of the device die and an outline of region 110B of the device die (shown in FIG. 1B) is overlaid on grooved substrate 1000 shown in FIG. 10A.

The positions of grooves 30G-1 and groove 30G-2 in grooved substrate 1000 may be such that when the die is attached to grooved substrate 1000 (on the opposite side of the substrate than the grooves, as shown in FIG. 1A), grooves 30G-1 and groove 30G-2 are across from region 110B of the die that includes the array of signal sense contact pads 20.

Figure 11:
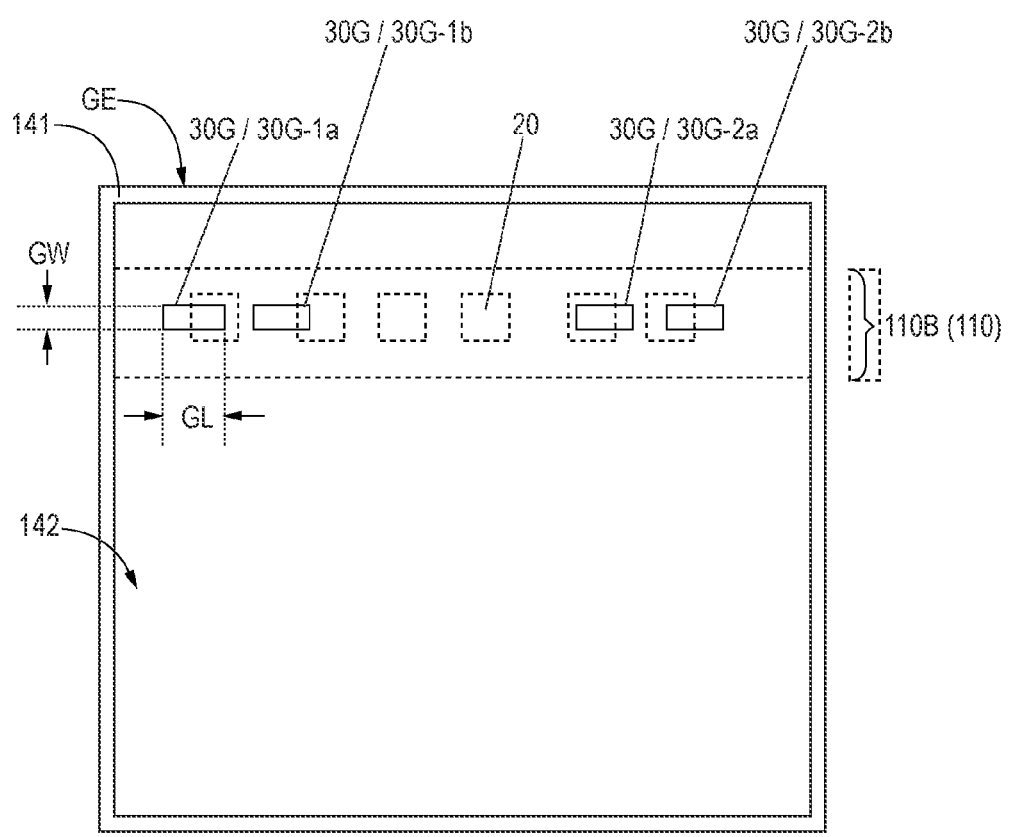

FIG. 11 shows an example grooved substrate 1100 in which the arrangement of groove 30G includes four grooves (i.e., 30G-1a, 30G-1b, 30G-2a and 30G-2b) placed to reduce the CTE of the grooved substrate.

Like substrate 140 (FIG. 1A) and grooved substrate 1000 (FIG. 10A) grooved substrate 1100 may, for example, include a dielectric layer (e.g., ceramic layer, polymer layer) 141 that is plated, coated, or printed, on both sides, with copper or other electrically conductive material layers (e.g., conductive layer 142). In example implementations, conductive layer may have a thickness in a range of about 0.2 to 1 millimeter (e.g., 0.4 millimeters).

Grooved substrate 1100 may include an arrangement of grooves 30G that includes four grooves (i.e., 30G-1a, 30G-1b, 30G-2a and 30G-2b). Each of grooves 30G-1a, 30G-1b, 30G-2a and 30G-2b may have a respective length GL, a width GW and a depth GD (like the depth of grooves 30G-1, FIG. 10B). Length GL may be in a range of 5 to 25 millimeters (e.g., 4 millimeters), width GW may be in a range of 5 to 20 millimeters (e.g., 1.3 millimeters), and depth GD (like the depth grooves 30G-1, FIG. 10B) may in a range of 0.05 to 1 millimeter (e.g., 0.1 millimeters, or 0.2 millimeters).

In example implementations, grooves 30G-1a, 30G-1b, 30G-2a and 30G-2b may be aligned with each other along their lengths GL.

The positions of grooves 30G-1a, 30G-1b, 30G-2a and 30G-2b in grooved substrate 1100 may be based on consideration of the dimensions of the device die (e.g., device die 110, FIG. 1B) and of region 110B of the die that includes the signal sense contact pads (e.g., CS pad 102, ES pad 103, gate pad 104, TS pad 105, TA pad 106, pad 107 etc.) of the die (FIG. 1B). For an example visual comparison of the relative dimensions of the die and grooves 30G-1a, 30G-1b, 30G-2a and 30G-2b an example array of signal sense contact pads 20 of the device die and an outline of region 110B of the device die (shown in FIG. 1B) is overlaid on grooved substrate 1100 shown in FIG. 11.

The positions of grooves 30G-1a, 30G-1b, 30G-2a and 30G-2b in grooved substrate 1100 may be such that when the die is attached to grooved substrate 1100 (on the opposite side of the substrate than the grooves, as shown in FIG. 1A), grooves 30G-1a, 30G-1b, 30G-2a and 30G-2b are across from region 110B of the die that includes the array of signal sense contact pads 20.

Figure 12:
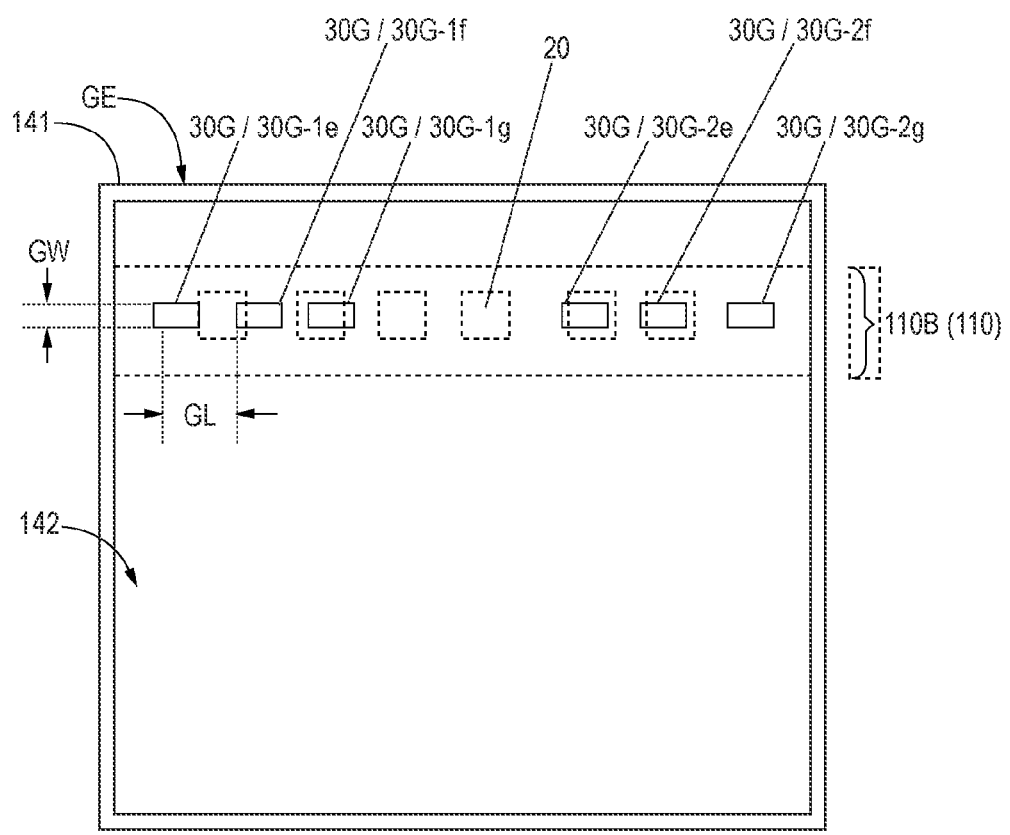

FIG. 12 shows an example grooved substrate 1200 in which the arrangement of groove 30G placed includes six grooves (i.e., 30G-1e, 30G-1f, 30G-1g, 30G-2e, 30G-2f, and 30G-2g) placed to reduce the CTE of the grooved substrate.

Like substrate 140 (FIG. 1A) and grooved substrate 1100 (FIG. 10A) grooved substrate 1200 may, for example, include a dielectric layer (e.g., ceramic layer, polymer layer) 141 that is plated, coated, or printed, on both sides, with copper or other electrically conductive material layers (e.g., conductive layer 142). In example implementations, conductive layer may have a thickness in a range of about 0.2 to 1 millimeter (e.g., 0.4 millimeters).

Grooved substrate 1200 may include an arrangement of grooves 30G that includes six grooves (i.e., 30G-1e, 30G-1f, 30G-1g, 30G-2e, 30G-2f, and 30G-2g). Each of grooves 30G-1e, 30G-1f, 30G-1g, 30G-2e, 30G-2f, and 30G-2g may have a respective length GL, a width GW and a depth GD. Length GL may be in a range of 5 to 25 millimeters (e.g., 3 millimeters), width GW may be in a range of 5 to 20 millimeters (e.g., 1.3 millimeters), and depth GD (like grooves 30G-1, FIG. 1B) may in a range of 0.05 to 1 millimeter (e.g., 0.1 millimeters, or 0.2 millimeters).

In example implementations, grooves 30G-1e, 30G-1f, 30G-1g, 30G-2e, 30G-2f, and 30G-2g may be aligned with each other along their lengths GL.

The positions of grooves 30G-1e, 30G-1f, 30G-1g, 30G-2e, 30G-2f, and 30G-2g in grooved substrate 1100 may be based on consideration of the dimensions of the device die (e.g., device die 110, FIG. 1B) and of region 110B of the die that includes the signal sense contact pads (e.g., CS pad 102, ES pad 103, gate pad 104, TS pad 105, TA pad 106, pad 107 etc.) of the die (FIG. 1B). For an example visual comparison of the relative dimensions of the die and grooves 30G-1e, 30G-1f, 30G-1g, 30G-2e, 30G-2f, and 30G-2g an example array of signal sense contact pads 20 of the device die and an outline of region 110B of the device die (shown in FIG. 1B) is overlaid on grooved substrate 1200 shown in FIG. 12.

The positions of grooves 30G-1e, 30G-1f, 30G-1g, 30G-2e, 30G-2f, and 30G-2g in grooved substrate 1200 may be such that when the die is attached to grooved substrate 1100 (on the opposite side of the substrate than the grooves, as shown in FIG. 1A), grooves 30G-1e, 30G-1f, 30G-1g, 30G-2e, 30G-2f, and 30G-2g are across from region 110B of the die that includes the array of signal sense contact pads 20.

Dual-side cooled power device modules or packages (e.g. package 100) may include power devices (e.g., silicon semiconductor die, silicon carbide (SiC) semiconductor die, insulated-gate bipolar transistors (IGBTs), metal-oxide-semiconductor field effect transistor (MOSFET) die, fast recovery diodes (FRD), etc.) stacked with patterned spacer blocks (e.g., spacer blocks 120, 200, 300, 400 of 500) to benefit from dual side cooling provided by a pair of opposing substrates (e.g., substrate 140 and substrate 180). Substrate 140 to which the die is attached may be a grooved substrate (e.g., grooved substrate 1000, 1100, or 1200). The dual-side cooled power device packages may be assembled together to provide high performance, reliability, and/or improvement in thermal management while maintaining proper electrical performance of the power device modules.

In some implementations, a device can be referred to as a device die or as a semiconductor die. Further, the pair of the opposing substrates 140, 180 in a device package may be referred to as the top substrate and the bottom substrate. A direction or axis that is substantially perpendicular to a plane aligned along each of the pair of opposing substrates can be referred to as a vertical direction. A direction or axis that is substantially parallel to the planes of the pair of the opposing substrates can be referred to as a lateral, a horizontal, or a longitudinal direction.

Figure 13:
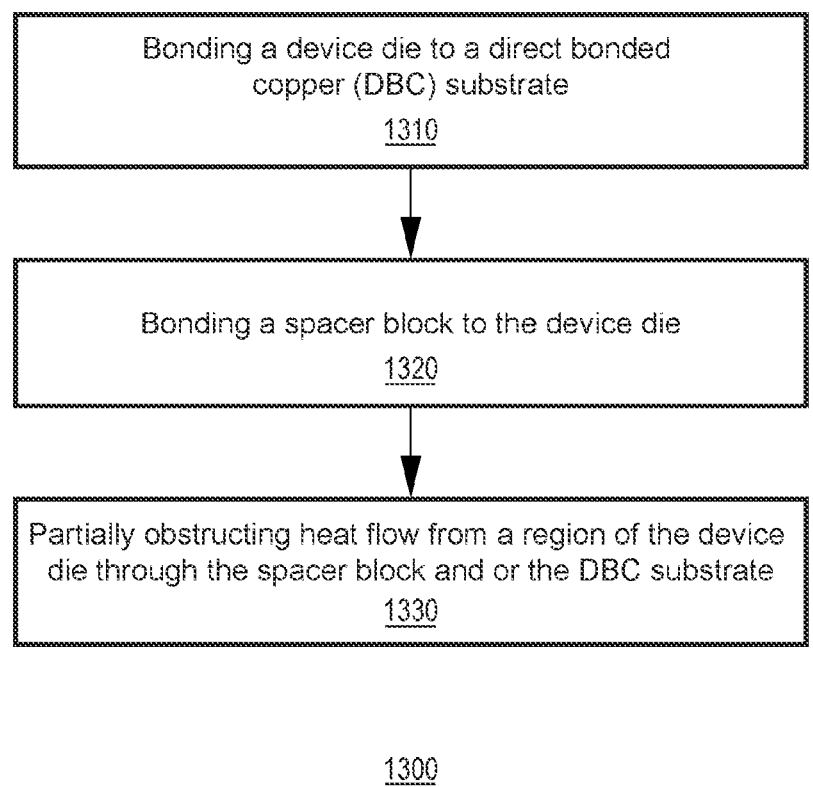
FIG. 13 illustrates an example method for mitigating temperature gradients and inhomogeneities in a dual-side cooled power device package.

FIG. 13 shows an example method 1300 for regulating or mitigating temperature gradients and inhomogeneities in dual-side cooled power device modules or packages.

Method 1300 includes bonding a device die to a direct bonded metal (DBM) substrate (1310), bonding a spacer block to the device die (1320), and at least partially reducing the CTE mismatches between the DBM substrate, the spacer block, and the device die (1330).

Partially reducing the CTE mismatches between the DBM substrate, the spacer block, and the device die 1330 can include at least one of: disposing an arrangement of pillars and grooves in a surface region of the spacer block bonded to the device die, disposing at least one cavity in the spacer block, or disposing a groove in an outer conductive layer of the DBC substrate.

Some implementations of the packages described herein may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), and/or so forth.

The terminology used herein is for the purpose of describing particular implementations only and is not intended to be limiting of the implementations. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Example implementations of the present inventive concepts are described herein with reference to cross-sectional illustrations that are schematic illustrations of idealized implementations (and intermediate structures) of example implementations. As such, variations from the shapes of the illustrations as a result, for example, of manufacturing techniques and/or tolerances, are to be expected. Thus, example implementations of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example implementations.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present implementations.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A package, comprising:
    a first direct bonded metal (DBM) substrate;
    a device die coupled to the first DBM substrate; and
    a spacer block having a first side coupled to a second DBM substrate and a second side coupled to the device die,
    the second side of the spacer block including a smooth surface region and a patterned surface region, the patterned surface region including an arrangement of recesses and protrusions, the protrusions in the arrangement coupling the patterned surface region to the device die.

2. The package of claim 1, wherein a signal sense contact pad is disposed in a region of the device die along an edge of the device die, and wherein the patterned surface region of the spacer block is coupled to the region of the device die including the signal sense contact pad.

3. The package of claim 1, wherein the patterned surface region has a nominal horizontal surface area equal to a sum of cross-sectional areas of the recesses and cross-sectional areas of the protrusions, and wherein only a fraction of the nominal horizontal surface area of the patterned surface region is coupled to the device die by the protrusions.

4. The package of claim 3, wherein the fraction is in a range of about 1/20 to 1/2.

5. The package of claim 4, wherein a top surface area of a pillar is a surface contact area in the patterned surface region for coupling to the device die.

6. The package of claim 4, wherein a pillar has a height h in a range of about 0.2 to 1 millimeter, and a width w in a range of about 0.1 to 1 millimeter.

7. The package of claim 4, wherein the patterned surface region extends from a first side of the spacer block to a second side of the spacer block, and wherein the arrangement of protrusions and recesses is disposed across the patterned surface region from about the first side of the spacer block to about the second side of the spacer block.

8. The package of claim 4, wherein the patterned surface region extends from a first side of the spacer block to a second side of the spacer block, and wherein the arrangement of protrusions and recesses is disposed in a first corner portion and a second corner portion of the spacer block, the first corner portion and the second corner portion of the spacer block being separated by a middle portion having a flat surface.

9. The package of claim 8, wherein the protrusions are mesas, and wherein the arrangement of protrusions and recesses includes mesas and recesses aligned parallel to a longitudinal direction from the first corner portion to the second corner portion of the spacer block.

10. The package of claim 8, wherein the protrusions are mesas, and wherein the arrangement of protrusions and recesses and mesas aligned perpendicular to a longitudinal direction from the first corner portion to the second corner portion of the spacer block.

11. A package, comprising:
a first direct bonded metal (DBM) substrate;
a device die coupled to the first DBM substrate; and
a spacer block coupled to the device die and a second DBM substrate,
the spacer block having a side including:
a first surface region coupled to a corresponding first region of the device die;
a second surface region coupled to a corresponding second region of the device die; and
at least one cavity disposed within the spacer block between the second surface region and the second DBM substrate.

12. The package of claim 11, wherein a signal sense contact pad is disposed in the corresponding second region of the device die along an edge of the device die.

13. The package of claim 11, wherein the at least one cavity disposed in the spacer block between the second surface region of the spacer block and the second DBM substrate has a shape of a rectangular box.

14. The package of claim 11, wherein the at least one cavity disposed in the spacer block includes a stack of cavities.

15. The package of claim 11, wherein the at least one cavity disposed in the spacer block between the second surface region of the spacer block and the second DBM substrate is disposed underneath a corner portion of the spacer block.

16. The package of claim 15, wherein the at least one cavity disposed underneath the corner portion of the spacer block has a shape of at least one of a rectangular box or a pie-shape box.

17. The package of claim 15, wherein the at least one cavity disposed underneath the corner portion of the spacer block includes a stack of box-like cavities.

18. A package, comprising:
a direct bonded metal (DBM) substrate including a first conductive layer disposed on a first side of a dielectric layer and a second conductive layer disposed on a second side of the dielectric layer;
a device die coupled to the first conductive layer on the first side of the dielectric layer of the DBM substrate, the device die including at least one device contact pad in a surface region of the device die; and
at least one groove disposed, across from the surface region of the device die coupled to the first conductive layer on the first side of the dielectric layer, in a surface of the second conductive layer disposed on the second side of the dielectric layer, the at least one groove at least partially reducing coefficient of thermal expansion (CTE) mismatches of corners of the device die and the at least one device contact pad in the surface region of the device die.

* * * * *